US007214609B2

(12) United States Patent
Jiang et al.

(10) Patent No.: US 7,214,609 B2
(45) Date of Patent: May 8, 2007

(54) METHODS FOR FORMING SINGLE DAMASCENE VIA OR TRENCH CAVITIES AND FOR FORMING DUAL DAMASCENE VIA CAVITIES

(75) Inventors: Ping Jiang, Plano, TX (US); Rob Kraft, Plano, TX (US); Guoqiang Xing, Shanghai (CN); Karen H. R. Kirmse, Richardson, TX (US); Eden Zielinski, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/313,491

(22) Filed: Dec. 5, 2002

(65) Prior Publication Data

US 2004/0110369 A1 Jun. 10, 2004

(51) Int. Cl.
*H01L 21/44* (2006.01)
*H01L 21/4763* (2006.01)
(52) U.S. Cl. ............... 438/637; 438/634; 257/E21.577; 257/E21.579
(58) Field of Classification Search ........ 438/637–640, 438/634, 623
See application file for complete search history.

(56) References Cited

U.S. PATENT DOCUMENTS

| 5,891,799 | A | | 4/1999 | Tsui |
| 5,981,379 | A | * | 11/1999 | Tsai ........................... 438/638 |
| 5,985,746 | A | | 11/1999 | Kapoor |
| 5,985,762 | A | * | 11/1999 | Geffken et al. ............. 438/687 |
| 6,057,227 | A | | 5/2000 | Harvey |
| 6,083,822 | A | * | 7/2000 | Lee ............................ 438/624 |
| 6,114,235 | A | * | 9/2000 | Foote et al. ................ 438/636 |
| 6,140,226 | A | * | 10/2000 | Grill et al. .................. 438/637 |
| 6,150,256 | A | | 11/2000 | Furukawa et al. |
| 6,156,643 | A | * | 12/2000 | Chan et al. ................. 438/638 |
| 6,174,804 | B1 | | 1/2001 | Hsu |
| 6,197,688 | B1 | * | 3/2001 | Simpson ..................... 438/678 |
| 6,221,759 | B1 | | 4/2001 | Bothra et al. |
| 6,270,634 | B1 | * | 8/2001 | Kumar et al. .......... 204/192.37 |

(Continued)

OTHER PUBLICATIONS

U.S. Appl. No. 10/834,436, filed Apr. 29, 2004, Jiang et al.

*Primary Examiner*—Alexander Ghyka
(74) *Attorney, Agent, or Firm*—Jacqueline J. Garner; W. James Brady, III; Frederick J. Telecky, Jr.

(57) ABSTRACT

Methods are disclosed for forming trench or via cavities in a single damascene interconnect structure, comprising etching a dielectric layer to form a cavity there and to expose an underlying etch-stop layer, and etching the exposed etch-stop layer to extend the cavity and to expose a conductive feature in an existing interconnect structure, wherein etching the portion of the dielectric layer and etching the exposed portion of the etch-stop layer are performed concurrently with substantially no intervening processing steps therebetween. Also disclosed are methods of forming a via cavity in a dual damascene interconnect structure, comprising forming an etch-stop layer over an existing interconnect structure, forming a dielectric layer over the etch-stop layer, etching a portion of the dielectric layer to form a via cavity in the dielectric layer and to expose a portion of the etch-stop layer, and etching the etch-stop layer to extend the via cavity, where the dielectric layer is covered during etching of the etch-stop layer.

7 Claims, 19 Drawing Sheets

U.S. PATENT DOCUMENTS

| | | |
|---|---|---|
| 6,281,585 B1 | 8/2001 | Bothra |
| 6,319,815 B1 * | 11/2001 | Iguchi et al. ............... 438/624 |
| 6,323,118 B1 | 11/2001 | Shih et al. |
| 6,323,121 B1 | 11/2001 | Liu et al. |
| 6,410,426 B1 | 6/2002 | Xing et al. |
| 2003/0008490 A1 | 1/2003 | Xing et al. |

* cited by examiner

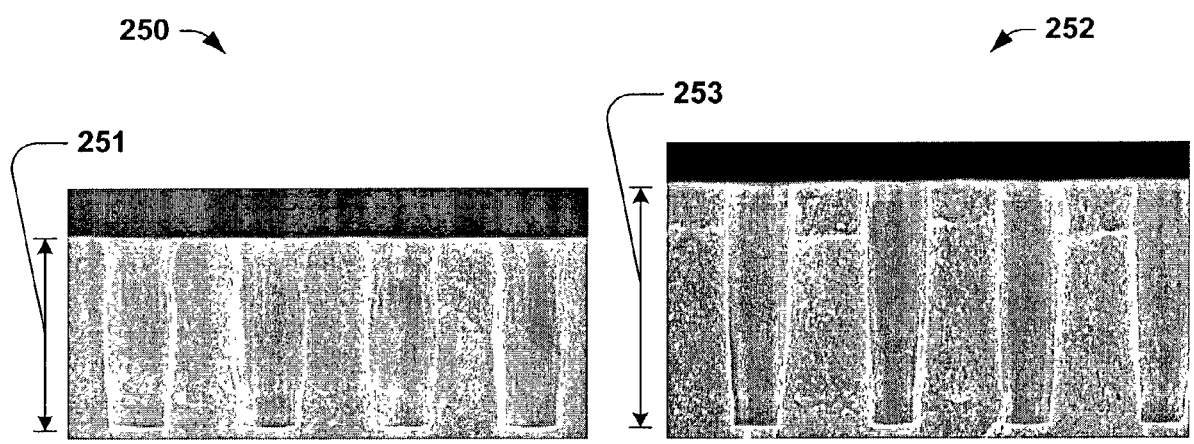
FIG. 5A  FIG. 5B

METHODS FOR FORMING SINGLE DAMASCENE VIA OR TRENCH CAVITIES AND FOR FORMING DUAL DAMASCENE VIA CAVITIES

FIELD OF INVENTION

The present invention relates generally to semiconductor devices and more particularly to methods for fabricating single and dual damascene interconnect structures in the fabrication of semiconductor devices.

BACKGROUND OF THE INVENTION

In the manufacture of semiconductor products such as integrated circuits, individual electrical devices are formed on or in a semiconductor substrate, and are thereafter interconnected to form electrical circuits. Interconnection of these devices within an integrated circuit is typically accomplished by forming a multi-level interconnect network structure in layers formed over the electrical devices, by which the device active elements are connected to other devices to create the desired circuits. Individual wiring layers within the multi-level network are formed by depositing an insulating or dielectric layer over the discrete devices or over a previous interconnect layer, and patterning and etching contact openings such as vias. Conductive material, such as tungsten is then deposited into the vias to form inter-layer contacts. A conductive layer may then be formed over the dielectric layer and patterned to form wiring interconnections between the device vias, thereby creating a first level of basic circuitry. Dielectric material is then deposited over the patterned conductive layer, and the process may be repeated any number of times using additional wiring levels laid out over additional dielectric layers with conductive vias therebetween to form the multi-level interconnect network.

As device densities and operational speeds continue to increase, reduction of the delay times in integrated circuits is desired. These delays are related to the resistance of interconnect metal lines through the multi-layer interconnect networks as well as to the capacitance between adjacent metal lines. In order to reduce the resistivity of the interconnect metal lines formed in metal layers or structures, recent interconnect processes have employed copper instead of aluminum. However, difficulties have been encountered in patterning (etching) deposited copper to form wiring patterns. Furthermore, copper diffuses rapidly in certain types of insulation layers, such as silicon dioxide, leading to insulation degradation and/or copper diffusion through the insulation layers and into device regions.

Copper patterning difficulties have been avoided or mitigated through the use of single and dual damascene interconnect processes in which cavities are formed (etched) in a dielectric layer. Copper is then deposited into the trenches and over the insulative layer, followed by planarization using a chemical mechanical polishing (CMP) process to leave a copper wiring pattern including the desired interconnect metal lines inlaid within the dielectric layer trenches. In a single damascene process copper trench patterns or vias are created which connect to existing interconnect structures thereunder, whereas in a dual damascene process, both vias and the trenches are filled at the same time using a single copper deposition and a single CMP planarization.

Copper diffusion issues have been addressed using copper diffusion barriers formed between the copper and the dielectric layers as well as between the copper and the silicon substrate. Such barriers are typically formed using conductive compounds of transition metals such as tantalum nitride, titanium nitride, and tungsten nitride as well as the various transition metals themselves. Insulators such as silicon nitride and silicon oxynitride have also been used as barrier materials between copper metallurgy and insulative layers. More recently, silicon carbide (SiC) has been used as a copper diffusion barrier material, as well as in etch-stop layers employed during trench and/or via cavity formation.

RC delay times have also been reduced by recent developments in low dielectric constant (low-k) dielectric materials formed between the wiring metal lines, in order to reduce the capacitance therebetween and consequently to increase circuit speed. Examples of low-k dielectric materials include the spin-on-glasses (SOGs), as well as organic and quasi-organic materials such as polysilsesquioxanes, fluorinated silica glasses (FSGs) and fluorinated polyarylene ethers. Totally organic, non silicaceous materials such as the fluorinated polyarylene ethers, are seeing an increased usage in semiconductor processing technology because of their favorable dielectric characteristics and ease of application. Other low-k insulator materials include organo-silicate-glasses (OSGs), for example, having dielectric constants (k) as low as about 2.6–2.8, and ultra low-k dielectrics having dielectric constants below 2.5. OSG materials are low density silicate glasses to which alkyl groups have been added to achieve a low-k dielectric characteristic.

Conventional single and dual damascene interconnect processing typically includes the formation of via cavities through a dielectric layer, in which the via etch process stops on an etch-stop layer underlying the dielectric. A resist ashing process is then employed to remove the via etch photoresist mask, and an optional wet clean operation is then performed to remove polymers and other residual materials from the via cavity. In the single damascene case, an etch-stop layer etch process is then performed to expose the underlying structure, such as a conductive feature (e.g., silicide contact or copper feature) in a pre-existing interconnect layer. The via cavity is then filled with copper and the wafer is planarized, after which further interconnect levels may then be fabricated. In the dual damascene case, after the via ashing and wet clean operations, a trench cavity is etched, followed by another ashing operation and optionally another wet clean. Thereafter an etch-stop layer etch is performed to expose the underlying structure, and the via and trench cavities are simultaneously filled with copper and the wafer is planarized.

In the conventional single and dual damascene interconnect processes, however, the etch-stop layer etch process not only etches the etch-stop layer, but also recesses the exposed dielectric material. As a result, the interlevel dielectric (ILD) and/or intra-metal dielectric (IMD) becomes thinner. In addition, in the single damascene case, the etch-stop layer etch and subsequent cleaning steps (e.g., ashing and wet clean) often change the via profile and increase the critical dimensions (CDs) thereof. As new technologies demand ever smaller CDs in semiconductor devices, CD control becomes more important. Furthermore, the conventional via sidewalls become bowed during the etch-stop etch and intervening cleaning after the via etch process, leading to via profile distortion. In the dual damascene case, the etch-stop etch and subsequent cleaning also affect the top dielectric surface and sidewalls of the trench cavity. Consequently, the effective dielectric constant of the resulting structure can be increased. Thus, there remains a need for improved methods for fabricating single and/or dual damascene interconnect structures in semiconductors wafers by which these and other adverse effects can be mitigated or overcome, without negatively impacting production costs or cycle times.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for fabricating single or dual damascene interconnect structures which may be employed to mitigate the above mentioned and other adverse effects. The invention may be employed to facilitate better via CD control, improve selectivity of etch-stop layer to IMD or ILD material, and/or to simplify the fabrication process flow.

In accordance with one aspect of the invention, methods are provided for forming trench or via cavities in a single damascene interconnect structure. The methods comprise etching a dielectric layer to form a cavity therein and to expose an underlying etch-stop layer. The exposed etch-stop layer is then etched to extend the cavity and to expose a conductive feature in an underlying (e.g., pre-existing) interconnect structure, wherein etching the portion of the dielectric layer and etching the exposed portion of the etch-stop layer are performed concurrently with substantially no intervening processing steps therebetween. Cleaning steps, such as ashing and wet cleaning, may thereafter be performed, followed by cavity fill and planarization.

In one implementation, the via etch and etch-stop etch are performed in-situ in a single etch tool, wherein the etch-stop etch is performed immediately after the via etch. The invention also provides for concurrent via and etch-stop etch operations, and for performing the etch-stop etch with at least a portion of the dielectric material covered. In one example, the etch-stop etch is performed immediately following the via etch, wherein the via etch resist remains covering the dielectric material during the etch-stop etch. Due to the presence of the resist during the etch-stop etch, more polymer deposition occurs on the via sidewalls to protect the via profile. In this manner, the invention may be employed so as to mitigate or avoid deleterious changes to the CDs and profiles of the resulting via or trench structures, and mitigates the reduction in dielectric thickness found in conventional processes. The invention facilitates simplification of the fabrication process flow to allow significant cost reduction, by eliminating the need for dedicated etch-stop etchers, freeing up ashers and wet hoods, and also allows significant reduction in cycle time. Moreover, the selectivity of etch-stop layer to IMD or ILD materials (e.g., SiC to OSG selectivity) may be improved, for example, due to the presence of resist during etch-stop etching.

Another aspect of the invention provides methods of forming a via cavity in a dual damascene interconnect structure, which may be employed in association with via-first, trench-first, and/or other dual damascene approaches. This aspect of the invention comprises forming an etch-stop layer over an existing interconnect structure and forming a dielectric layer over the etch-stop layer. A portion of the dielectric layer is then etched to form a via cavity in the dielectric layer and to expose a portion of the etch-stop layer. The etch-stop layer is then etched to extend the via cavity, where the dielectric layer is covered by via resist pattern during etching of the etch-stop layer. Because the resist covers the dielectric during the etch-stop etch, more polymer deposition occurs on the via sidewalls, which helps to preserve the via profile. The method may be employed in both via-first and trench-first dual damascene process flows, wherein the via etch and etch-stop etch may be performed in-situ in a single etch tool, and wherein the etch-stop etch may be performed immediately after the via etch.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 5A is a cross-sectional side elevation view scanning electron microscope (SEM) image of single damascene vias formed according to conventional processes following etch-stop etching;

FIG. 5B is a cross-sectional side elevation view SEM image of single damascene vias formed according to the present invention following etch-stop etching;

DETAILED DESCRIPTION OF THE INVENTION

Figure 1A:
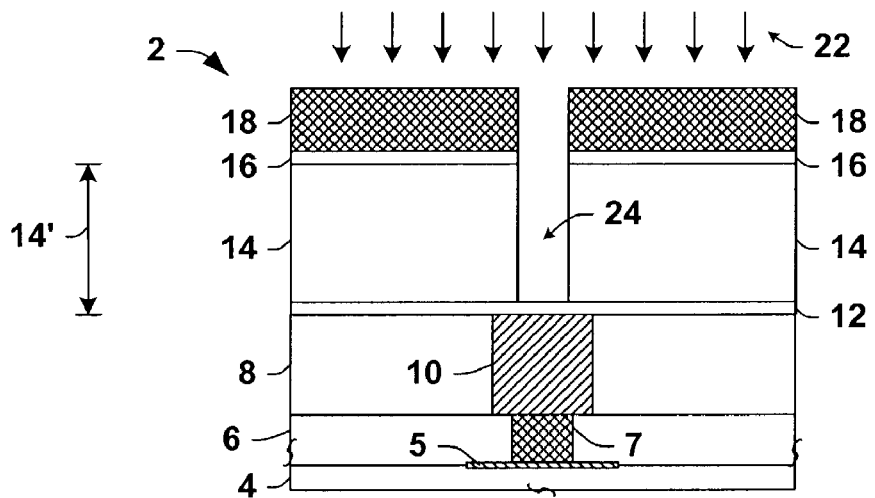
FIGS. 1A–1F are partial side elevation views in section illustrating a conventional single damascene via formation flow.

The present invention will now be described with reference to the attached drawings, wherein like reference numerals are used to refer to like elements throughout. The invention relates to methods for forming single and/or dual damascene interconnect structures, including via and/or trench cavities or openings during interconnect processing of integrated circuits and other semiconductor devices. One or more implementations of the invention are hereinafter illustrated and described in the context of single or dual damascene trench and/or via cavity formation in low-k organo-silicate-glass (OSG) structures, where silicon carbide (SiC) etch-stop layers are employed. However, it will be appreciated by those skilled in the art that the invention is not limited to the exemplary implementations illustrated and described hereinafter. In particular, the various aspects of the invention may be employed in association with processing of devices using OSG, FSG, or other low-k or ultra low-k dielectric materials, and other types of etch-stop layer materials. Further, the dual damascene formation methods of the invention may be employed in association with via-first and/or trench-first implementations.

Referring initially to FIGS. 1A–1F, one or more problems or shortcomings of conventional single damascene interconnect processing are illustrated and described to provide an appreciation of the benefits possible with the invention. FIG. 1A illustrates a wafer 2 comprising a silicon substrate 4, in which a conductive silicide structure 5 is formed. An initial contact layer is formed over the substrate 4, including a dielectric 6 with a tungsten contact 7 extending therethrough. A first interconnect structure is formed over the contact layer, including an etch-stop layer (not shown), over which a dielectric 8 is deposited. A conductive feature 10 is formed through the dielectric 8 the etch-stop layer to provide electric coupling to the contact 7. To form a single damascene interconnect level, a SiN or SiC etch-stop layer 12 is formed over the dielectric 8 and the conductive feature 10, and a dielectric layer 14 is formed over the etch-stop layer 12 to a thickness 14' of about 5000–6000 Å. A bottom anti-reflective coating (BARC) layer 16 is deposited over the dielectric 14 and a resist mask 18 is formed over the BARC layer 16. In FIG. 1A, a via etch process 22 is performed to form a via cavity 24 in the BARC and dielectric layers 16 and 14, respectively, which is stopped on the etch-stop material 12.

Figure 1B:
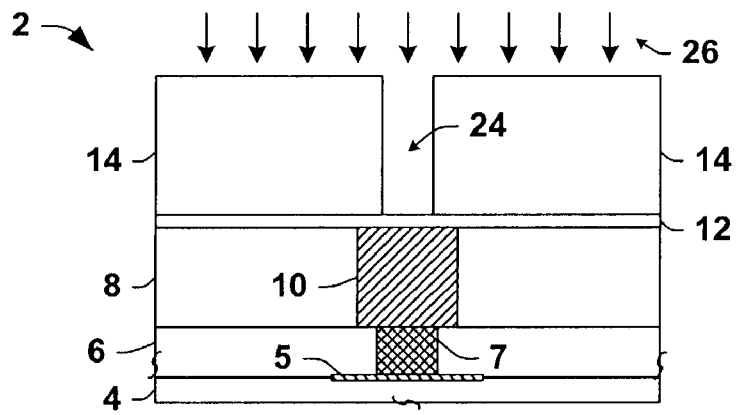
Figure 1C:
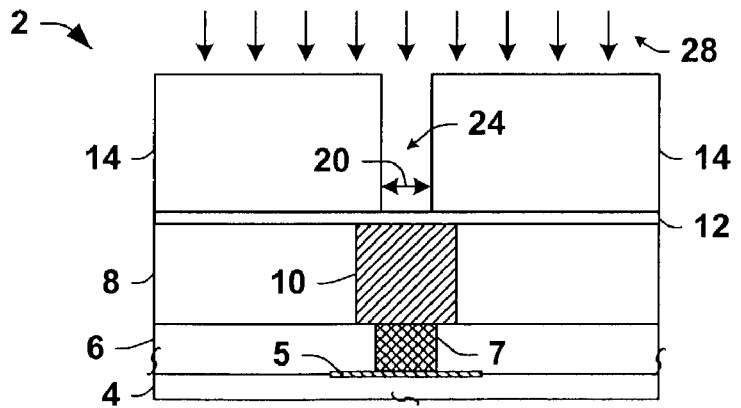
Figure 1D:
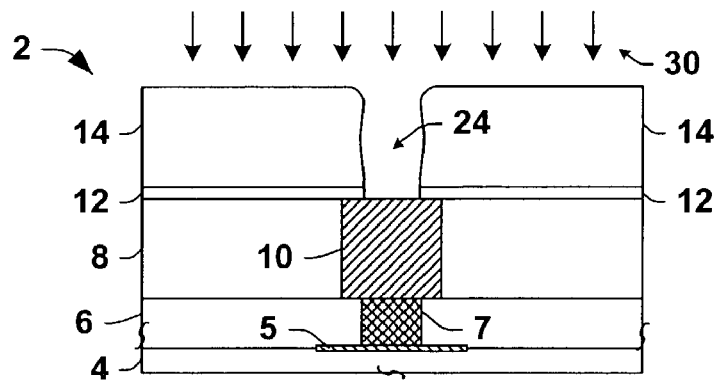
Figure 1E:
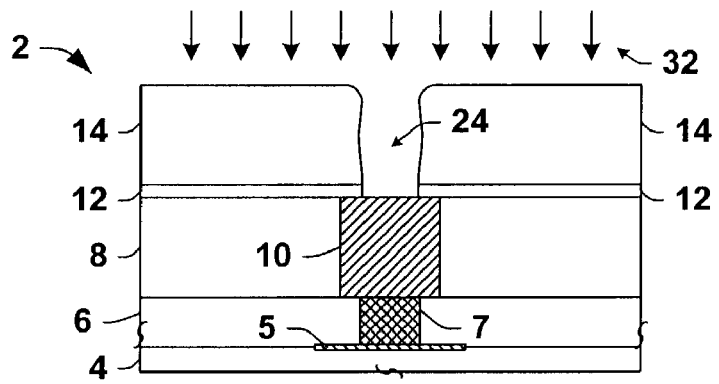
Figure 1F:
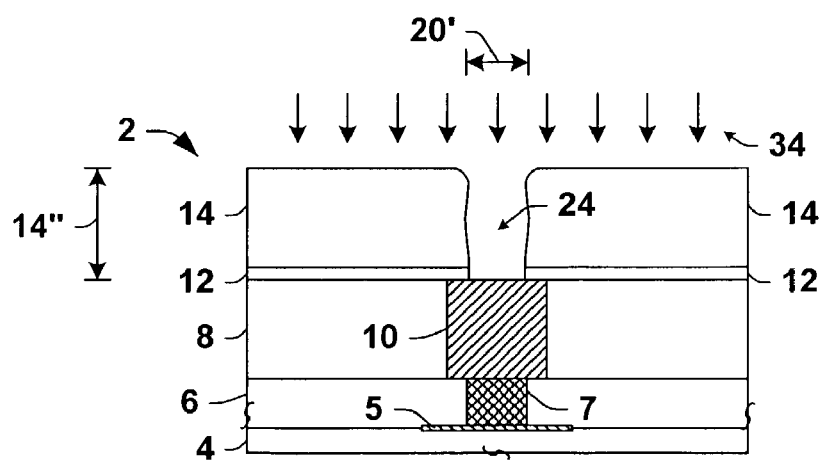

Thereafter in FIG. 1B, a resist ashing process 26 is used to remove the mask 18 and BARC 16, and a wet clean operation 28 is performed in FIG. 1C. The resulting via cavity 24 has a critical dimension (CD) 20. In FIG. 1D, an etch-stop etch process 30 is performed to etch the exposed etch-stop layer material 12 at the bottom of the via cavity 24, which also removes dielectric material from the exposed top of the layer 14, as well as from the sidewalls of the cavity 24. Thereafter in FIG. 1E, another ashing operation 32 is performed and a wet clean 34 is performed in FIG. 1F. Following this conventional single damascene process, the resulting via cavity 24 has a critical dimension 20' (FIG. 1F) significantly larger than the original dimension 20 (FIG. 1C). In addition, the etch-stop etch and cleaning processes 30, 32, and 34 have reduced the dielectric (e.g., ILD) thickness of the layer 14 to a smaller dimension 14" (FIG. 1F), which is significantly less than the starting dimension 14' (FIG. 1A).

Figure 2A:
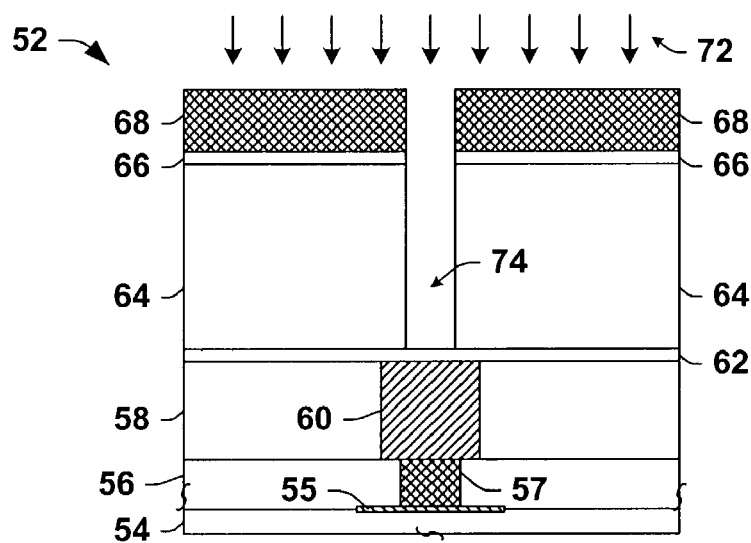
FIGS. 2A–2F are partial side elevation views in section illustrating a conventional via-first dual damascene formation flow.
Figure 2B:
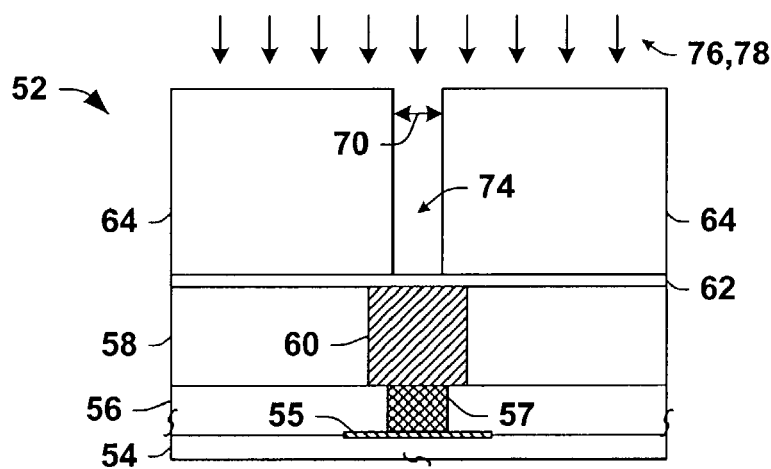

Referring now to FIGS. 2A–2F, similar problems are seen in conventional dual damascene processing. FIG. 2A illustrates a wafer 52 comprising a substrate 54, in which a conductive silicide structure 55 is formed. An initial contact layer is formed over the substrate 54, including a dielectric 56 and a conductive contact 57. A first interconnect structure is formed over the contact layer, including an etch-stop layer (not shown), and a dielectric 58 in which a conductive feature 60 is formed to provide electric coupling to the contact 57. An etch-stop layer 62 is formed over the dielectric 58 and over the contact 60, and a dielectric layer 64 is formed over the etch-stop layer 62 to a thickness of about 7000–8000 Å. A BARC layer 66 is then formed over the dielectric 64 and a resist mask 68 is formed over the BARC layer 66. A via etch process 72 is performed in FIG. 2A to form a via cavity 74 in the layers 66 and 64, stopping on the etch-stop layer 62. In FIG. 2B, a resist ashing process 76 and a wet clean 78 are performed to remove the mask 68 and the BARC 66, resulting in a via cavity critical dimension of 70.

Figure 2C:
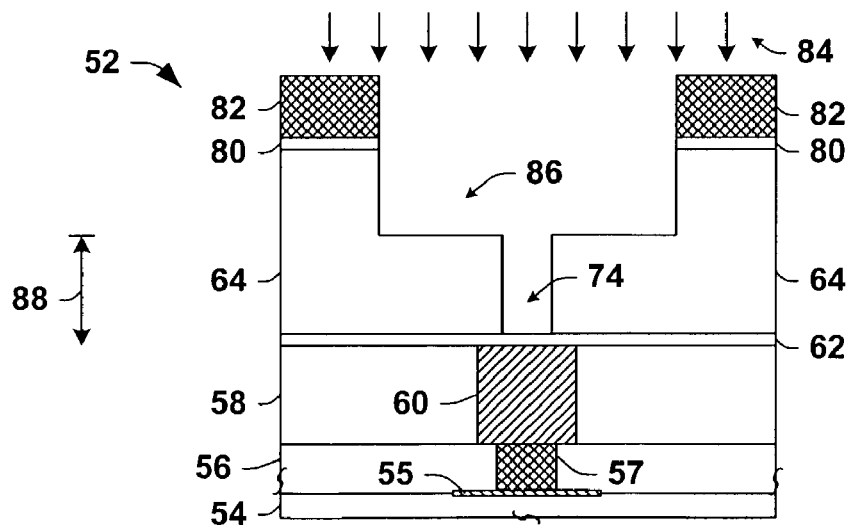
Figure 2D:
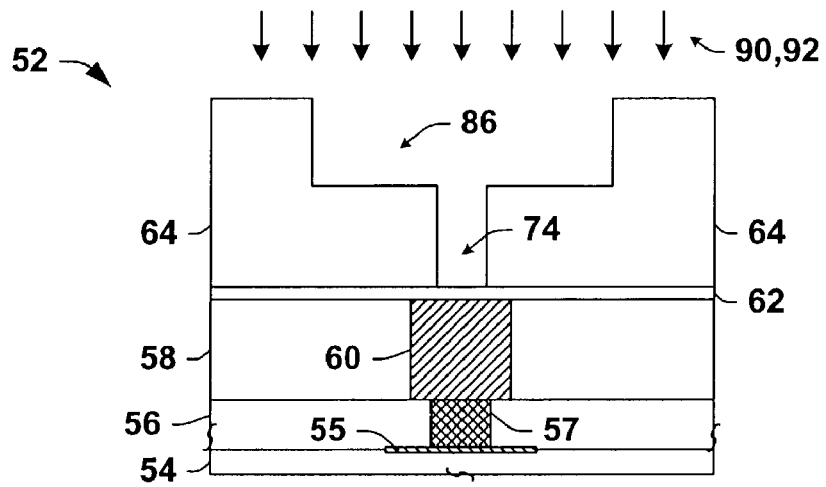
Figure 2E:
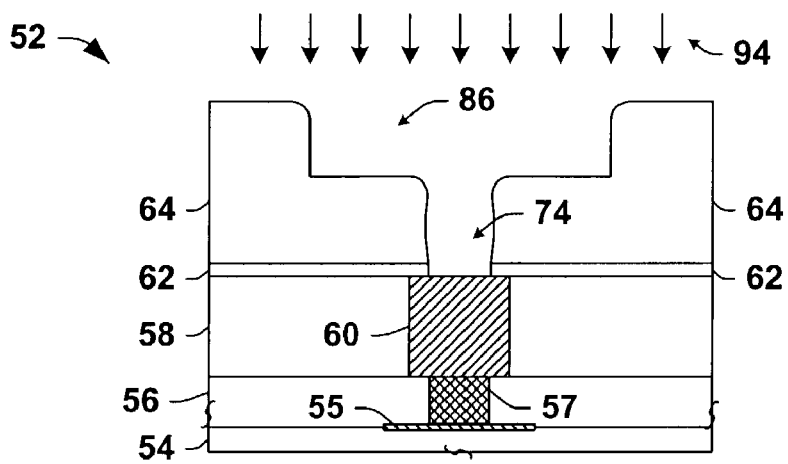

In FIG. 2C, a second BARC layer 80 and a trench resist mask 82 are formed over the wafer 52, and a trench etch operation 84 is performed to form a trench cavity or opening 86, leaving a trench bottom surface a thickness 88 of about 3000–4000 Å above the previous interconnect dielectric material 58. Another ashing operation 90 and wet clean 92 are performed in FIG. 2D, and an etch-stop etch process 94 is then performed in FIG. 2E to etch the exposed etch-stop layer material 62 at the bottom of the via cavity 74. As illustrated in FIG. 2E, the etch-stop etch 94 also removes dielectric material from the exposed top of the layer 64, from the bottom and sidewalls of the trench cavity 86, and also from the sidewalls of the via cavity 74. Thereafter in FIG. 2E, another ashing operation 96 and a wet clean 98 are performed. This leaves the structure illustrated in FIG. 2F, wherein the etch-stop layer etch 94 in particular has reduced the ILD thickness 88' from it's original thickness 88 (FIG. 2C), as well as increased the CDs for the via 74 and the trench 86 from their original dimensions (FIG. 2C).

Figure 2F:
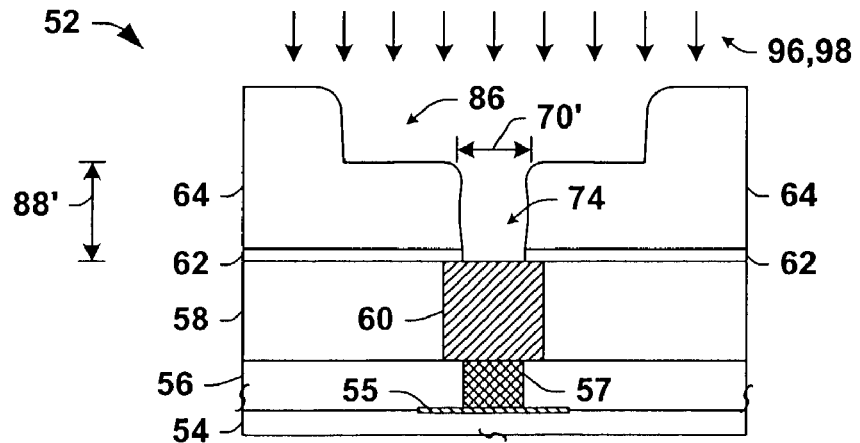

Following this dual damascene process, the resulting via cavity 74 in FIG. 2F has a critical dimension 70' significantly larger than the original dimension 70 of FIGS. 2B and 2C. Also, the etch-stop etch and cleaning processes 94, 96, and 98 have reduced the dielectric (e.g., ILD) thickness of the layer, as illustrated and described further below with respect to example images of FIGS. 5A, 8A, and 8C below. In the conventional single and dual damascene processes illustrated in FIGS. 1A–1F and 2A–2F, respectively, it is thus seen that the etch-stop layer etch steps in FIGS. 1D and 2E adversely affect the profiles and CDs of the interconnect cavities and structures, leading to thinning of the ILD/IMD layers and corresponding increase in the effective dielectric constant of the finished structures. In order to reduce the capacitance between interconnect routing lines and vias and consequently to increase circuit speed in modern semiconductor devices, the present invention provides methods for single and dual damascene interconnect structure formation by which these difficulties can be mitigated or avoided.

Figure 3:
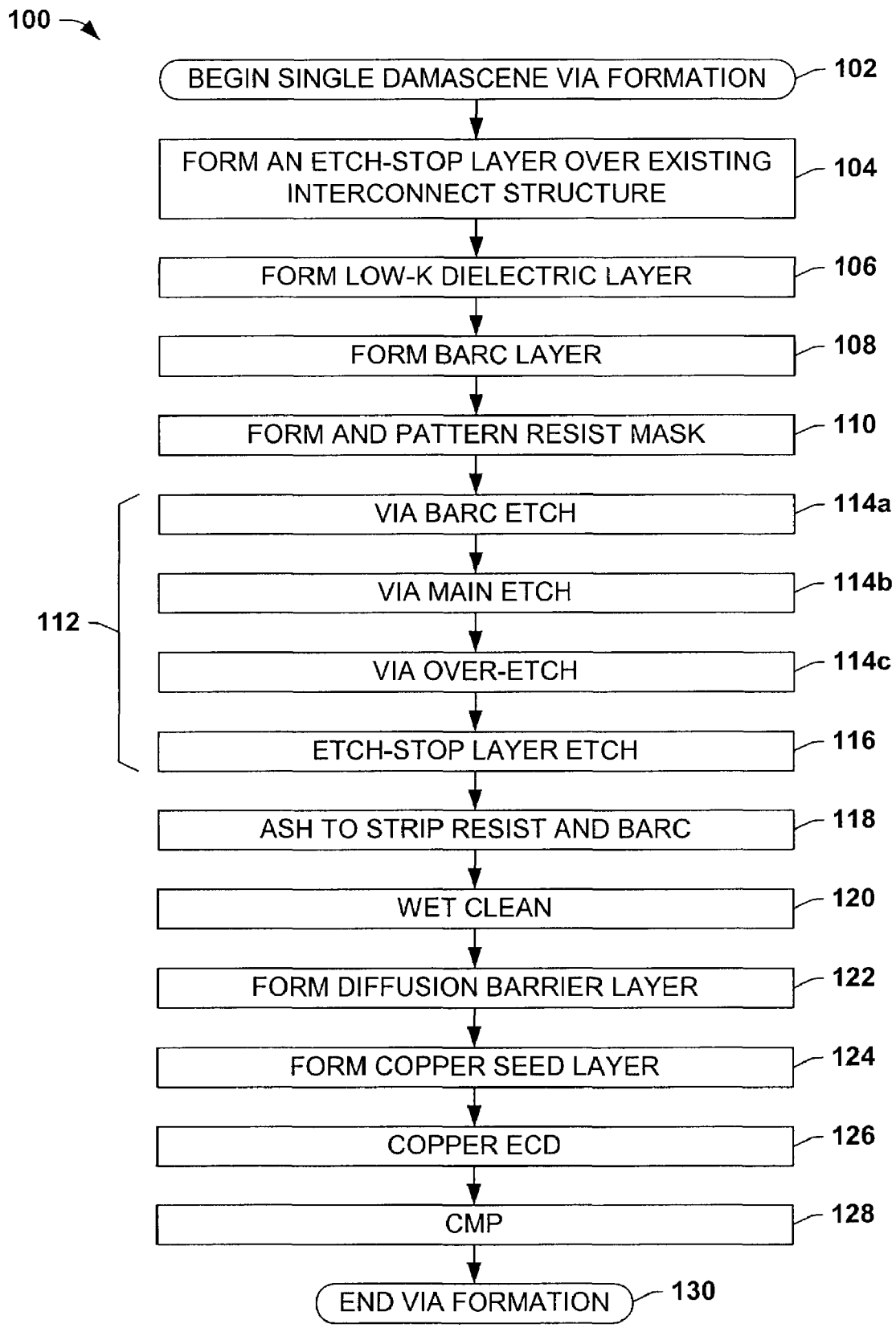
FIG. 3 is a flow diagram illustrating an exemplary method of forming a single damascene interconnect structure in accordance with an aspect of the present invention.

Referring now to FIG. 3, an exemplary method 100 is illustrated and described hereinafter for forming a single damascene interconnect structure, such as a via or a trench. Although the method 100 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The exemplary method 100 is described hereinafter in the context of a single damascene via formation in a semiconductor wafer. However, it will be appreciated that the exemplary method 100, and other single damascene methodologies of the present invention, may be employed alternatively or in combination in forming a single damascene trench structure. Beginning at 102, the method 100 comprises forming an etch-stop layer over an existing interconnect structure at 104 (e.g., over a previous damascene structure or over an initial contact level), and forming a low-k dielectric layer over the etch-stop material at 106. Any appropriate etch-stop and dielectric materials and layer fabrication techniques may be employed at 104 and 106, respectively, such as depositing SiN or SiC etch-stop material to a thickness of about 600 Å using any appropriate deposition technique such as chemical-vapor deposition (CVD) or the like. A hardmask or cap layer can be optionally used. A BARC (bottom anti-reflective coating) layer is optionally deposited at 108 of any appropriate organic material having anti-reflective properties to a thickness of about 800 Å over the dielectric layer. A resist mask is then deposited and patterned at 110, having an opening in a prospective via region of the wafer, for example, using known photolithographic techniques and photoresist materials.

The dielectric layer may be formed at 106 via any appropriate technique, for example, by deposition of organosilicate-glass (OSG) material to a thickness of about 5000 Å over the SiC etch-stop layer. Any appropriate deposition process may be employed in forming the OSG layer at 106. In operation, the low-k dielectric layer provides insulation between overlying and underlying conductive features, such as between a conductive feature in an existing interconnect structure and later-formed features above or in trenches in the low-k dielectric. In this regard, it is noted that OSG material provides relatively low dielectric constant characteristics desirable in avoiding or mitigating RC delays and cross-talk between signals in the finished semiconductor device. In addition, it will be appreciated that any dielectric materials may be used in forming the dielectric layer at 106, including but not limited to OSG, FSG, ultra low-k dielectrics, or the like, wherein the invention is not limited to use in association with the OSG materials discussed herein.

Thereafter, an in-situ process flow 112 is performed in accordance with one aspect of the invention, wherein a via cavity is formed through the BARC, dielectric, and etch-stop layers, which may be performed in a single reactive ion etch (RIE) tool, for example, without breaking vacuum. At 114a, the exposed BARC layer is etched, using the patterned resist as a mask, and a via main etch is performed at 114b to remove a portion of the dielectric layer, creating a via cavity or opening therein. Thereafter, a via over-etch process is performed at 114c to remove the remaining portion of the dielectric material in the cavity and to expose a portion of the underlying etch-stop layer material. At 116, the exposed portion of the etch-stop material is etched to extend the cavity and to expose a conductive feature in the underlying interconnect structure, with substantially no intervening processing between the via etch acts of 114a–114c and the etch-stop etch of 116.

In the exemplary method 100, the via etch at 114a–114c and the etch-stop etch at 116 are performed in-situ within a single RIE etch tool. However, other implementations are possible within the scope of the invention, wherein the etch-stop etch at 116 is performed concurrently with the via etch 114 or immediately thereafter. In addition, the invention also contemplates alternative implementations in which the via and etch-stop etch acts are performed with substantially no processing steps therebetween. For example, no ashing or wet etch operations are performed between the via etch 114 and the etch-stop layer etch at 116 in the illustrated method 100. Thus, compared with the conventional single damascene methods (e.g., FIGS. 1A–1F above), the exemplary method 100 provides coverage of the upper dielectric surface during the etch-stop etch at 116 because the patterned resist mask remains until after the etch-stop etch 116 is completed.

It is further noted that while the exemplary method 100 provides in-situ etching of the via cavity through the dielectric layer (e.g., 114) and etch-stop etching to extend the via cavity through the etch-stop layer, that other implementations are possible within the scope of the present invention where these or equivalent acts are performed in different etch tools. Moreover, one or more process steps or acts may be performed between the via and etch-stop etch acts in accordance with the invention where the dielectric layer is covered during the etch-stop etch. In the illustrated method 100, the resist mask from the via etch steps remains during the etch-stop etch 116. However, other implementations are possible within the scope of the invention, wherein all or a portion of the dielectric is covered by any means during the entirety of, or during a portion of, the etch-stop etch 116. Also, while the exemplary method 100 provides a multi-step etch (e.g., 114b, 114c) through the dielectric layer, other implementations are contemplated, wherein the BARC etch, the via etch, and/or the etch-stop etch acts may individually comprise single step and/or multi-step operations, within the scope of the present invention.

In the illustrated example, the acts 114a–114c and 116 are performed in a single RIE etch tool, with appropriate etch chemistries being changed accordingly, in order to remove material from the layer currently exposed in the prospective via region (e.g., the BARC layer, then the dielectric layer, then the etch-stop layer). Furthermore, while illustrated and described with respect to organic BARC materials, OSG type low-k dielectric material, and SiC or SiN etch-stop layer materials, any appropriate materials may be employed in forming these layers in accordance with the invention, where appropriate etch chemistries and selectivities may be selected in performing the etch operations 114–116 to form and extend the via cavity. Furthermore, although illustrated in the context of a single damascene via formation flow, the invention contemplates implementations for forming single damascene trench structures and cavities, wherein the above described etch techniques may be employed to form a trench opening or cavity through the BARC, dielectric, and etch-stop layers.

In one exemplary implementation of the method 100, the via etch through the dielectric layer at 114b and 114c comprises a two-step process having different etch chemistries for each such step. The main etch at 114b is performed to etch the majority of the dielectric material in the cavity, and leaves about 1000–2000 Å of dielectric material remaining. The process parameters are then switched to the over-etch at 114c, which is time controlled to stop on the etch-stop layer, although other forms of process control may be employed to stop on the etch-stop material, wherein the exemplary over-etch at 114c has a higher selectivity to the etch-stop layer than does the main etch at 114b.

Once the etch-stop layer has been exposed, the etch process parameters are again adjusted for etching the etch-stop material with a selectivity to the underlying (e.g., pre-existing) interconnect structure, so as to expose an underlying conductive feature (e.g., copper structure). It is noted that the method 100 provides a resist mask over the dielectric layer while etching the exposed portion of the etch-stop layer at 116, since there is no intervening ashing or wet etch process to remove the via resist mask. This, in turn, advantageously mitigates or avoids etch-stop etch related damage to the dielectric material during the etch-stop etch at 116, by which the via CD and profile, and the dielectric layer thickness are protected.

Following the in-situ process at 112, the method 100 proceeds to 118, where a resist stripping or ashing operation is performed to remove the resist mask initially formed at 110, as well as the BARC material deposited at 108. A wet clean operation is then optionally performed at 120, such as using a wet solvent to remove any polymer from the RIE etch acts which may still remain after the ashing operation at 118. A copper diffusion barrier layer is then formed at 122, which serves to line the via cavity, examples of which include conductive compounds of transition metals such as tantalum nitride, titanium nitride, and tungsten nitride as well as the various transition metals themselves. Insulators such as silicon nitride and silicon oxynitride may also be used, as well as SiC. A seed copper layer is then deposited over the diffusion barrier at 124, to facilitate subsequent copper filling of the via cavity.

An electrochemical deposition (ECD) process is then performed at 126 to deposit a copper layer over the wafer, which fills the via cavity, and overlies the barrier layer on top of the remaining dielectric. Any appropriate copper deposition process or acts 124–126 may be employed, which may be a single step or a multi-step process. Thereafter at 128, a chemical mechanical polishing (CMP) process is performed to planarize the upper surface of the device, which ideally stops on the dielectric layer and reduces the diffusion barrier and the deposited copper. In this manner, the planarization process 128 electrically separates the conductive (e.g., copper) via from other such vias formed in the device, whereby controlled connection of the underlying conductive feature with subsequently formed interconnect structures can be achieved, after which the method 100 ends at 130.

Figure 4A:
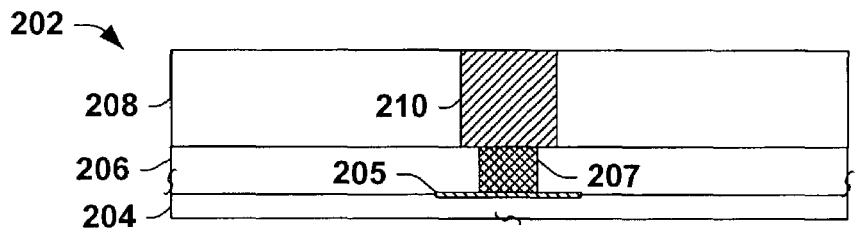
FIGS. 4A–4P are partial side elevation views in section illustrating fabrication of an exemplary single damascene via or trench in accordance with the invention.
Figure 4B:
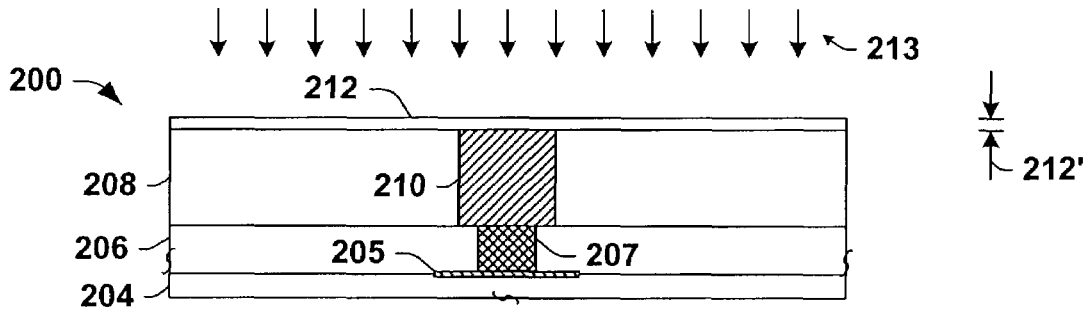
Figure 4C:
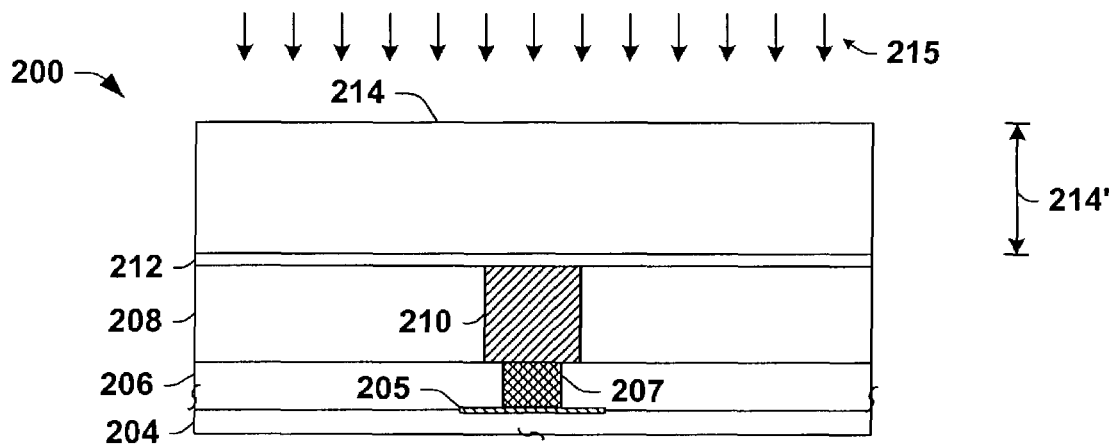
Figure 4D:
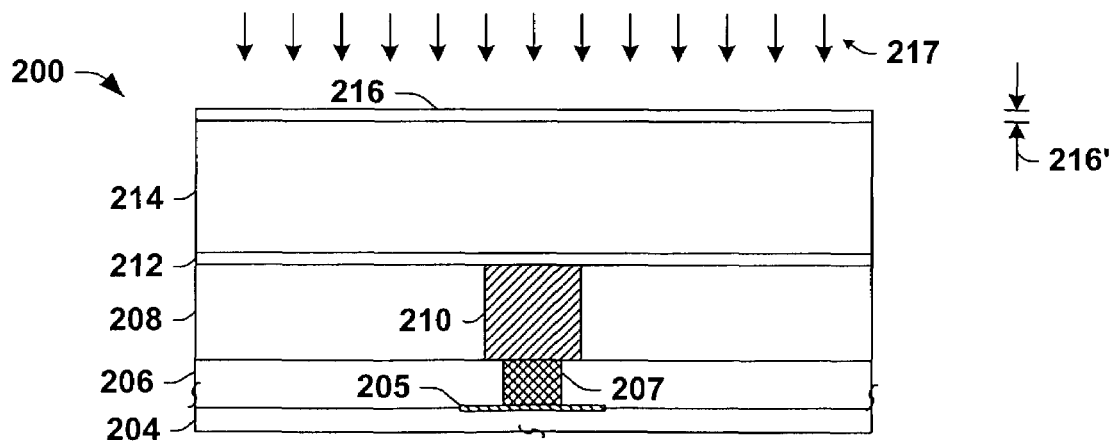
Figure 4E:
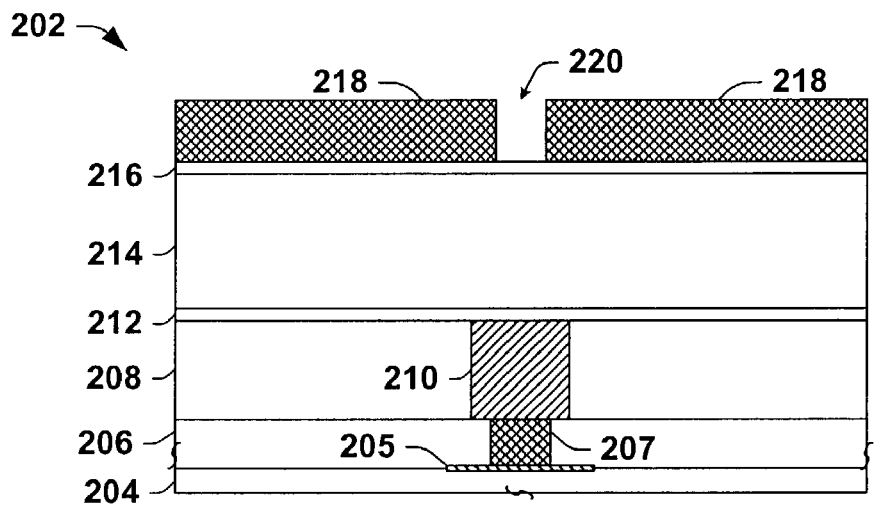
Figure 4F:
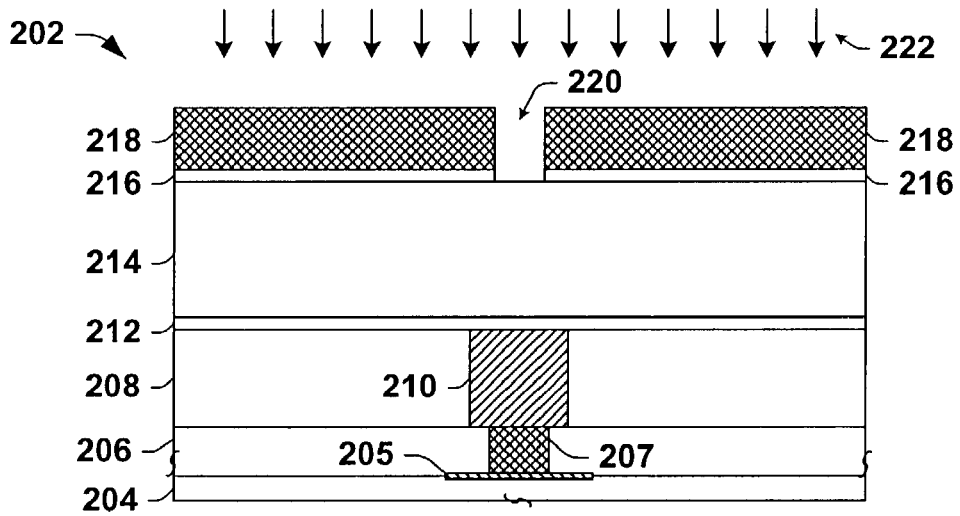
Figure 4G:
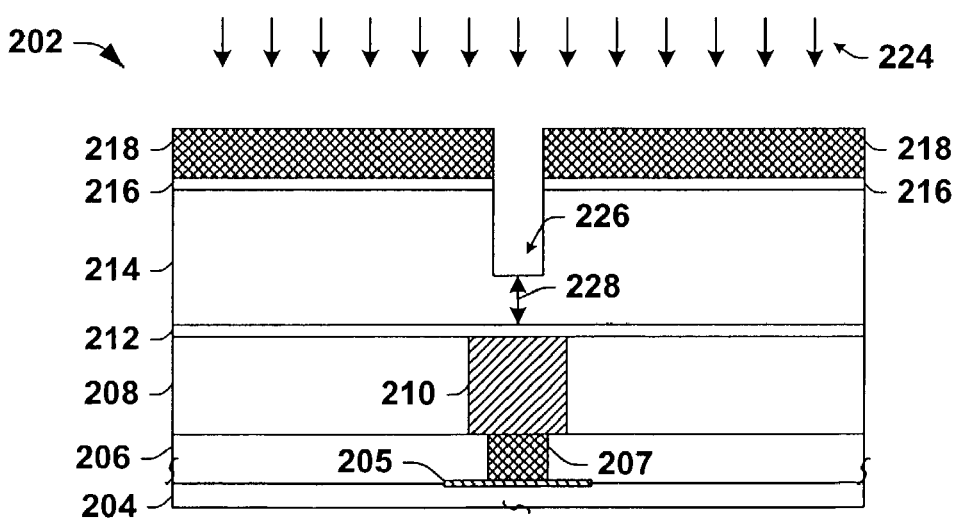
Figure 4H:
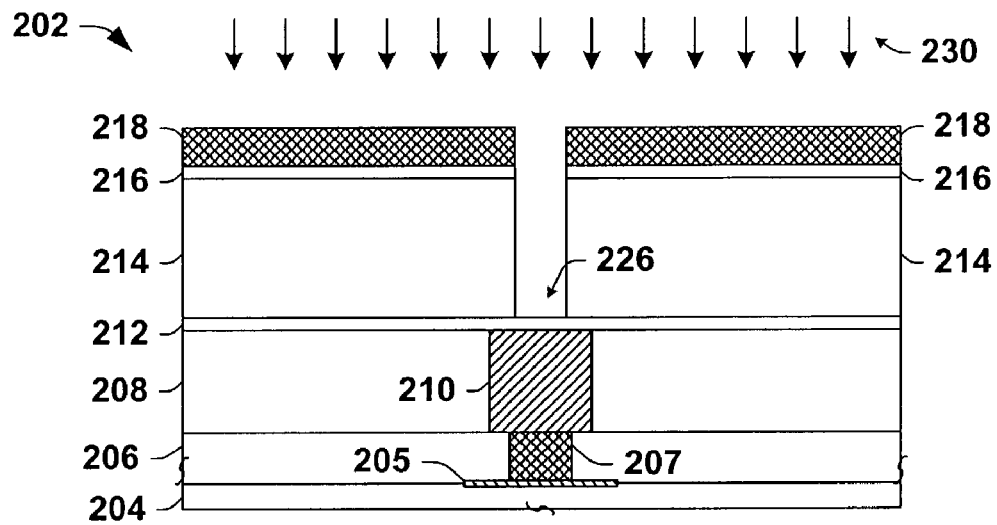
Figure 4I:
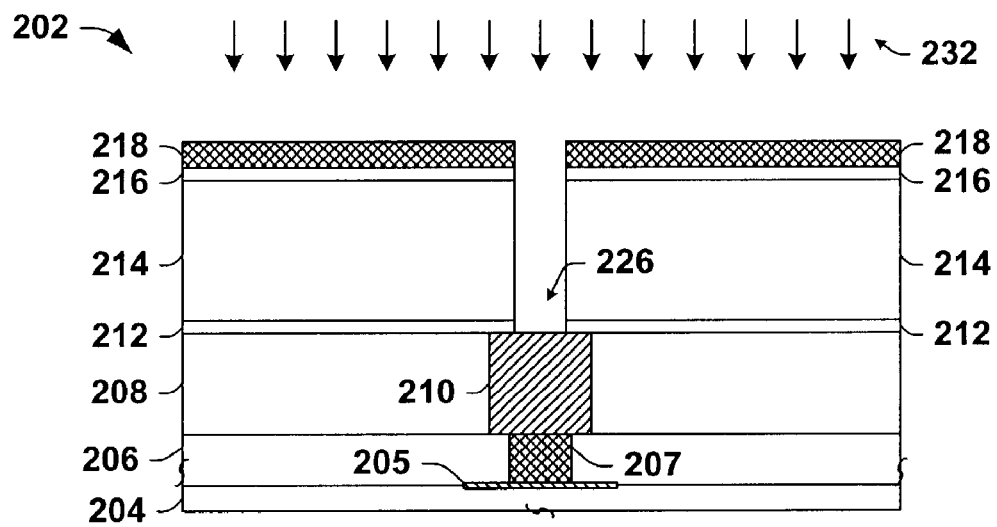
Figure 4J:
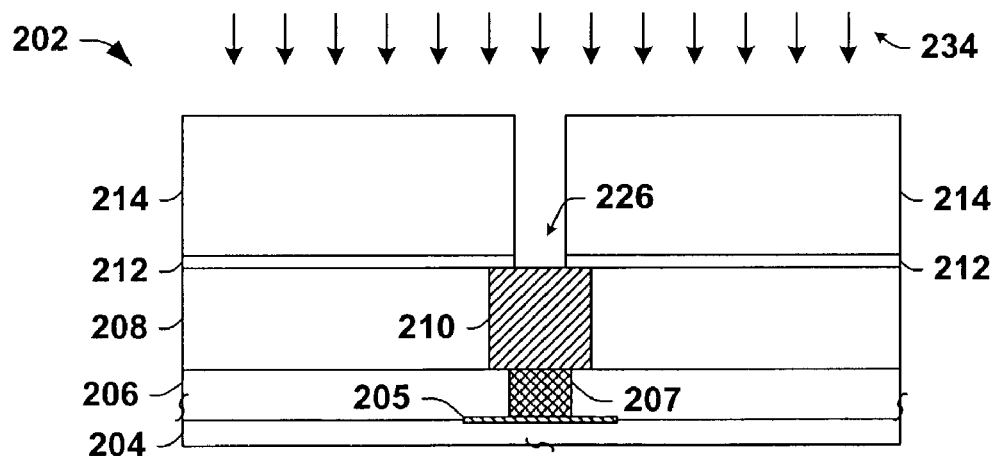
Figure 4K:
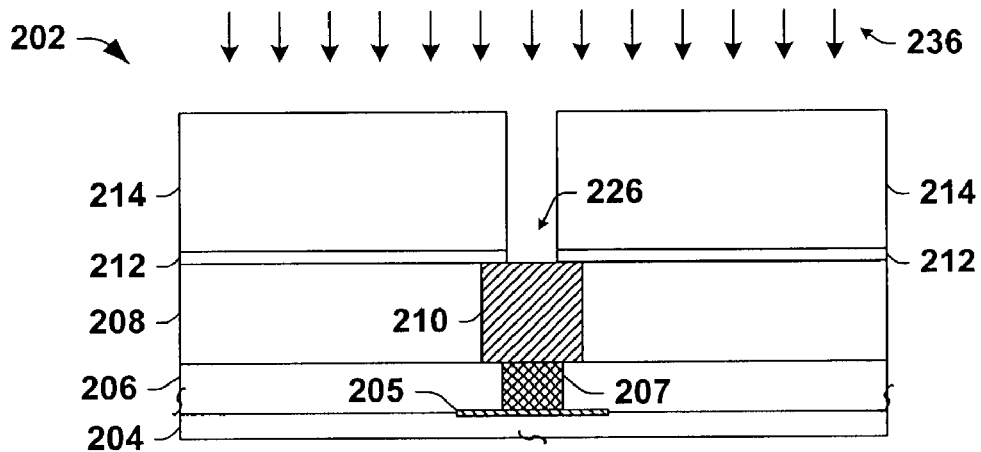
Figure 4L:
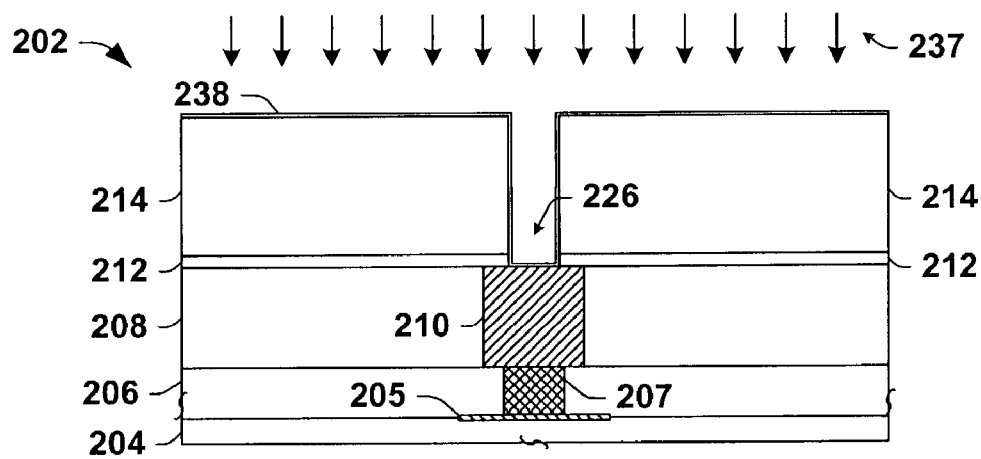
Figure 4M:
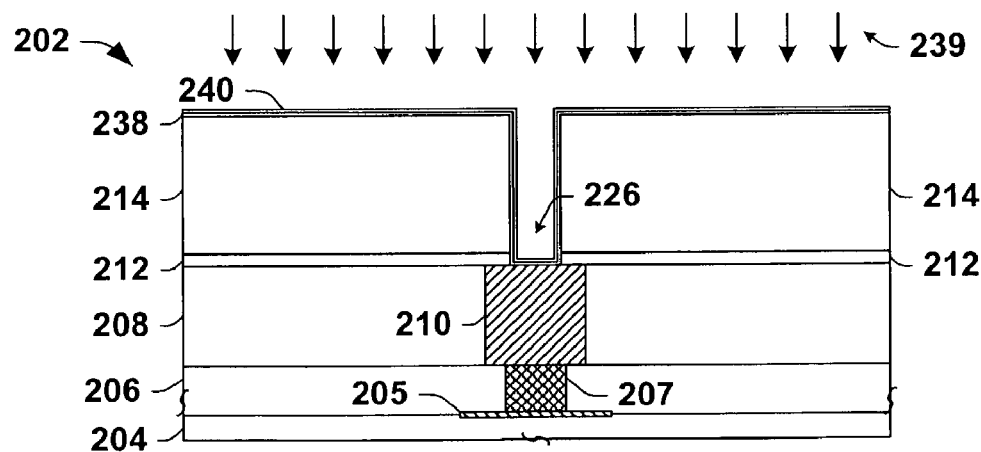
Figure 4N:
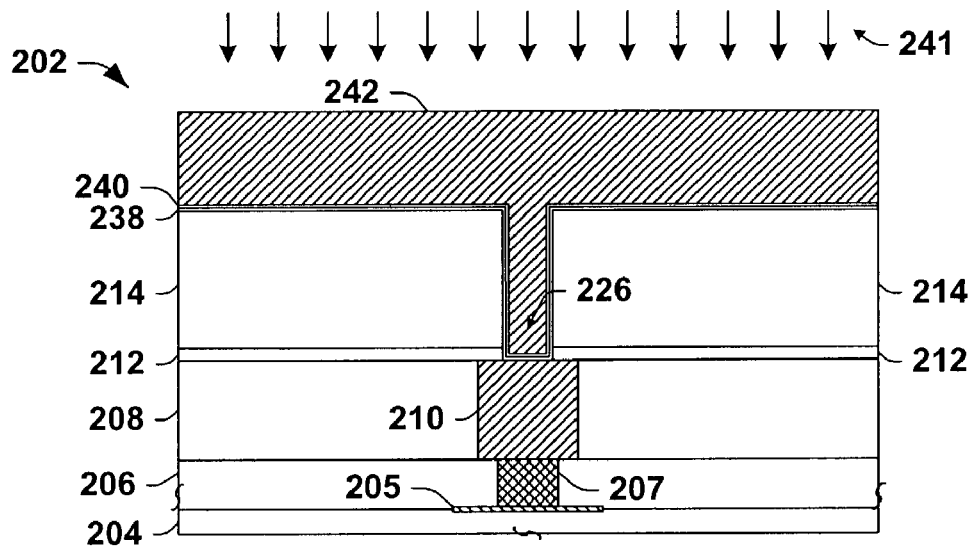
Figure 4O:
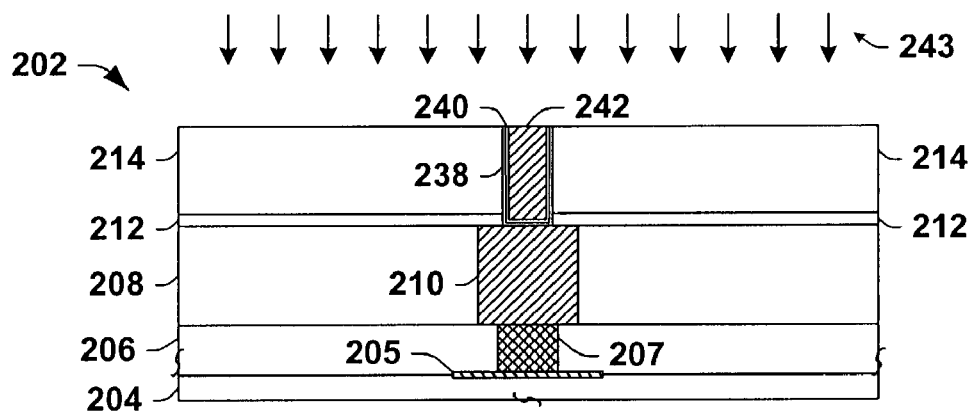
Figure 4P:
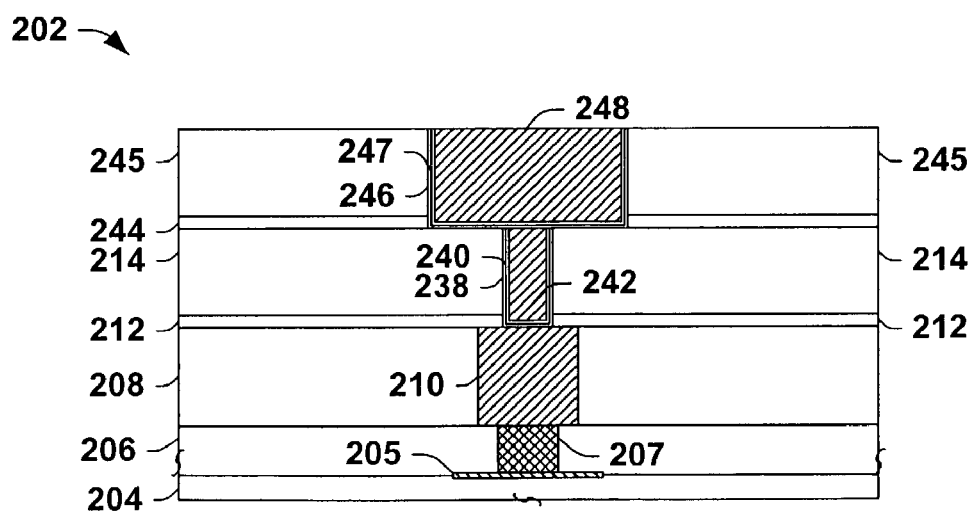

Referring also to FIGS. 4A–4P, an exemplary wafer 202 is, illustrated undergoing single damascene interconnect structure formation processing in accordance with this aspect of the invention. FIGS. 4A–4P illustrate formation of a single damascene via structure. However, the invention may also be employed in formation of a single damascene trench structure (not shown) according to the principles illustrated and described herein. FIG. 4A illustrates the wafer 202 at an intermediate stage of fabrication, comprising a silicon substrate 204, in which a conductive silicide structure 205 is formed. An initial contact layer is formed over the substrate 204, comprising a dielectric 206 with a tungsten contact 207 extending therethrough, and electrically contacting the silicide 205. A previously formed interconnect structure is formed over the contact layer, comprising an etch-stop layer (not shown) and a dielectric 208 in which a conductive feature (e.g., copper trench metal) 210 is formed to provide electric coupling to the contact 207. The invention may be employed in association with any existing interconnect structure to provide electrical coupling to a conductive feature therein. In FIG. 4B, a SiN or SiC etch-stop layer 212 is formed over the dielectric 208 and the conductive feature 210 of the existing interconnect structure to a thickness 212' of about 500–800 Å via a deposition process 213. A dielectric layer 214, such as a low-k OSG dielectric material or the like, is formed via a deposition process 215 in FIG. 4C over the etch-stop layer 212 to a thickness 214' of about 5000–6000 Å.

An organic BARC layer 216 is deposited in FIG. 4D over the dielectric 214 via a deposition process 217 to a thickness 216' of about 600–800 Å. Thereafter in FIG. 4E, a resist mask 218 is formed over the BARC layer 216 having an opening 220 in a prospective via region. In FIG. 4F, a via BARC etch process 222 is performed to remove material from the BARC layer 216 in the via region 220. A via main etch process 224 is then employed in FIG. 4G to form a via cavity 226 in the dielectric layer 214, leaving a thickness 228 of dielectric material 214 unetched at the bottom of the via cavity 226, wherein the via main etch 224 has a substantial etch rate and is substantially anisotropic. A via over-etch process 230 (e.g., which is highly selective with respect to the etch-stop layer 212) is then performed in FIG. 4H to further form the cavity 226 through the rest of the dielectric layer 214, stopping on and exposing a portion of the underlying etch-stop layer 212. An etch-stop etch 232 is performed immediately thereafter (e.g., concurrently with the over-etch 226) in FIG. 4I.

Thereafter in FIG. 4J, a resist ashing process 234 is used to remove the remaining resist mask 218 and the BARC layer 216, and a wet clean operation 236 is performed in FIG. 4K. It is noted in FIG. 4K, that unlike the conventional single damascene process (e.g., FIG. 1F above), the profile and CD of the via cavity 226 remains essentially the same as prior to the etch-stop etch 232, since the resist mask 218 was maintained during the etch-stop etch 232 (FIG. 4I). In this regard, having the resist 218 over the dielectric 214 helps preserve the CD and profile of the via 226, but it is also possible that the CD and profile are OK without resist 218. In FIG. 4L, a copper diffusion barrier layer 238 is formed via a deposition process 237, and a copper seed layer 240 is formed in FIG. 4M via a deposition process 239. An ECD copper deposition process 241 is then performed in FIG. 4N to deposit copper 242, thereby filling the via cavity 226 and overlying the remainder of the wafer 202, after which a CMP planarization process 243 is employed in FIG. 4O to planarize the wafer 202, thus completing the conductive single damascene via structure.

Thereafter, as illustrated in FIG. 4P, a subsequent interconnect level or layer may be constructed, for example, using the above-described single damascene techniques, comprising another etch-stop layer 244, a low-k dielectric layer 245, and a trench structure comprising a copper diffusion barrier layer 246, a copper seed layer 247, and ECD deposited copper fill material 248. Any number of such layers or levels may be fabricated in accordance with the present invention, to provide electrical coupling to the conductive feature 210 in the existing interconnect structure of the wafer 202.

Referring also to FIGS. 5A and 5B, scanning-electron microscope (SEM) images are provided to illustrate some of the advantages which may be realized in practicing the single damascene methods of the invention, including the exemplary method 100 above, as contrasted with conventional techniques. FIG. 5A provides a cross-sectional SEM image 250 of single damascene vias after etch-stop etching, formed according to conventional processes (e.g., FIGS. 1A–1F above). FIG. 5B is a cross-sectional SEM image 252 (at the same scale as the image 250 of FIG. 5A) of single damascene vias formed according to the present invention (e.g., FIGS. 3 and 4A–4P) following etch-stop etching.

As can be seen from FIGS. 5A and 5B, the conventional single damascene technique (FIG. 5A) provides significant reduction in the dielectric thickness 251 (e.g., due to the exposure of the dielectric material during the etch-stop etch or a poor selectivity to the top dielectric), whereas the thickness 253 of the dielectric in the image 252 (FIG. 5B) is maintained according to the invention. This allows process flow steps (e.g., such as the dielectric layer formation in FIG. 4C above) to be adjusted to provide the desired final thickness, without having to compensate for etch-related reduction experienced in the past. Further, the via profiles are significantly better in the image 252 than in the conventional case of the image 250 (for example, less bowing in FIG. 5B than in FIG. 5A). Furthermore, the CDs in the image 252 of FIG. 5B are significantly smaller than those in FIG. 5A.

Figure 6A:
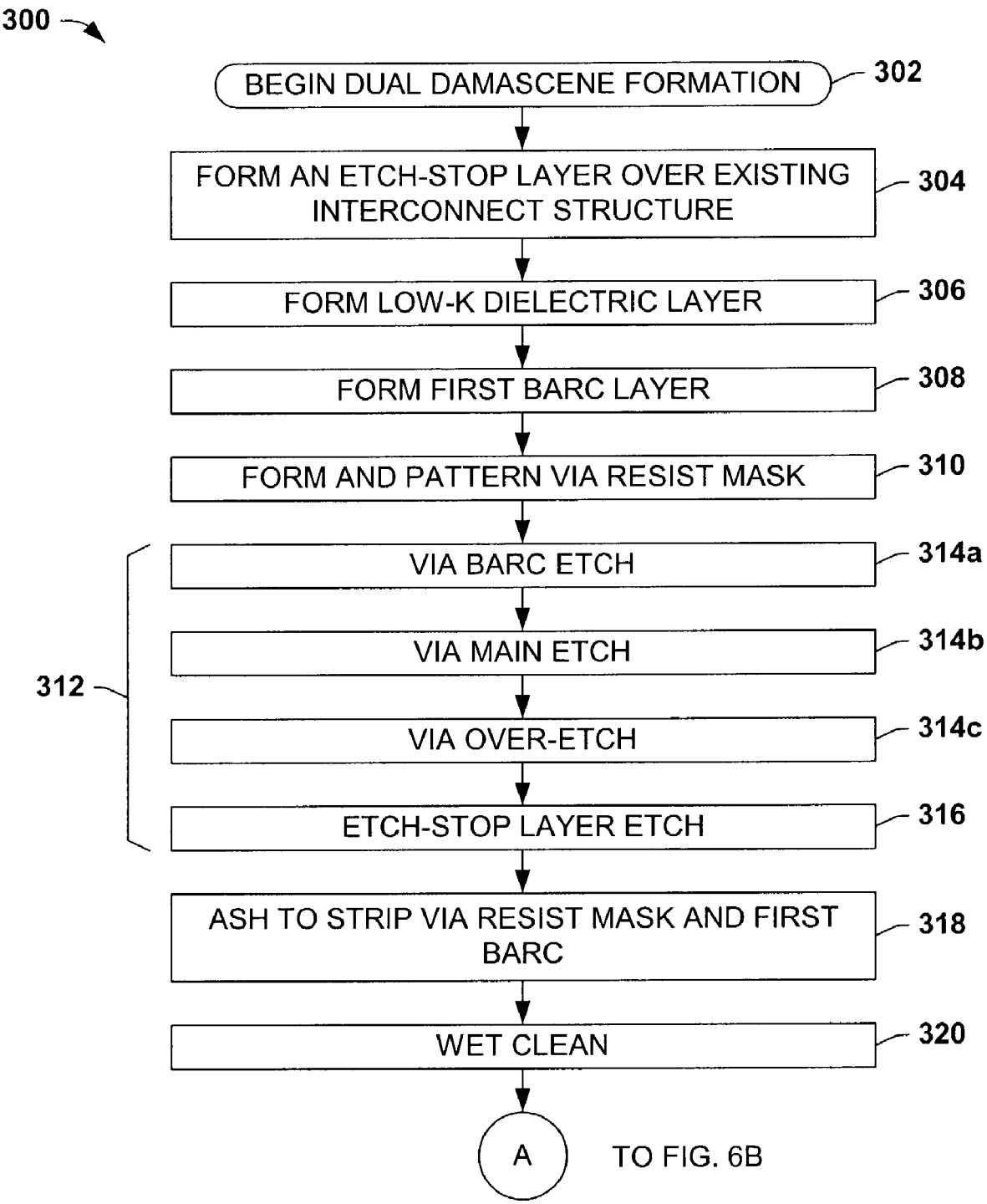
FIGS. 6A and 6B provide a flow diagram illustrating an exemplary method of forming a dual damascene interconnect structure in accordance with another aspect of the present invention.
Figure 6B:
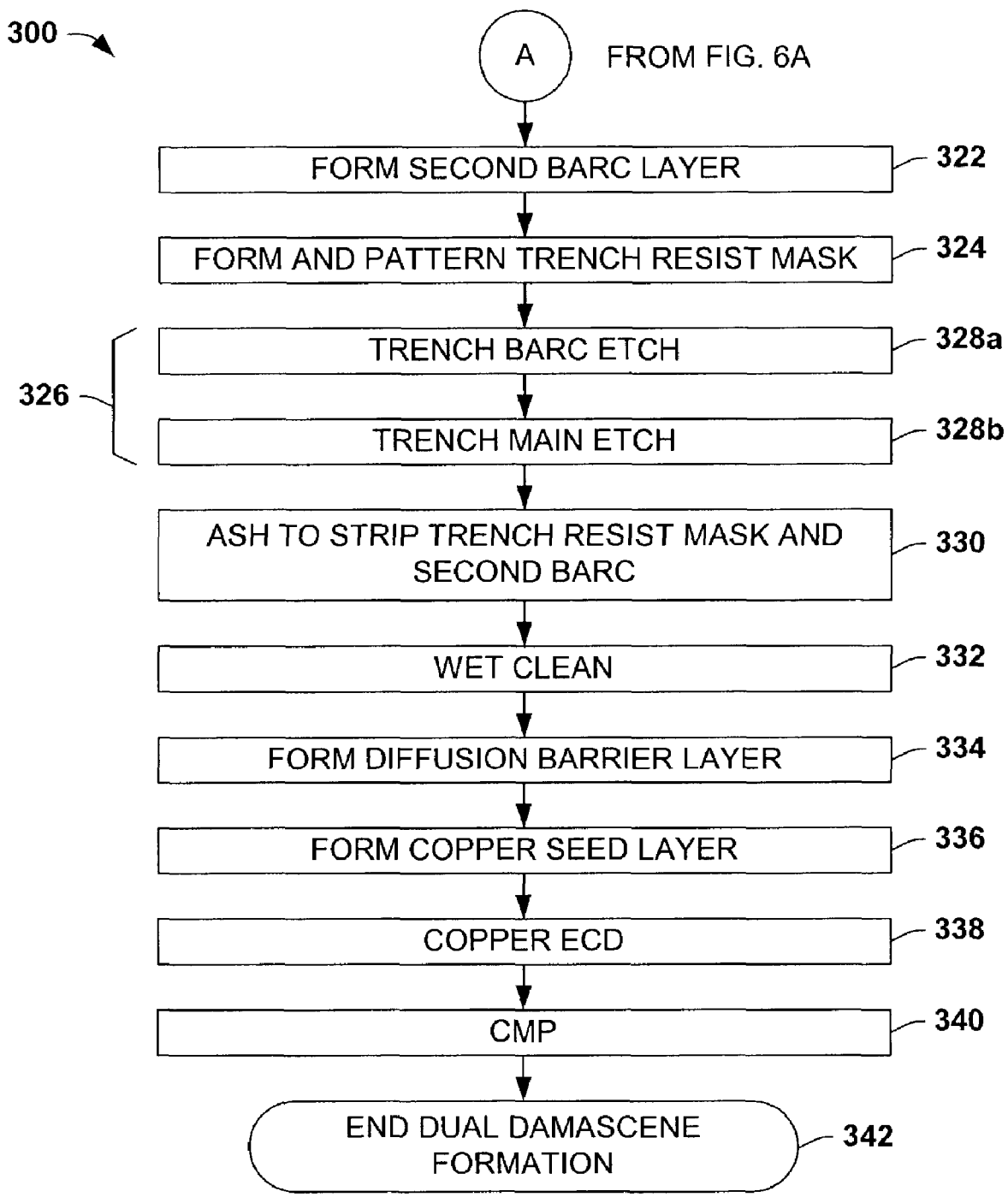

According to another aspect of the invention, methods are provided for forming a dual damascene interconnect structure overlying an existing interconnect structure in a semiconductor wafer, which may be employed in a via-first implementation or in a trench-first dual damascene implementation to provide electrical coupling to a conductive feature in the existing interconnect structure. An exemplary via-first method 300 is illustrated in FIGS. 6A and 6B. While the method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

Beginning at 302, the method 300 comprises forming an etch-stop layer over an existing interconnect structure at 304, forming a low-k dielectric layer over the etch-stop material at 306, and optionally forming a first BARC layer at 308 over the dielectric layer, in a manner similar to the acts 104–108 above. A via resist mask is then formed and patterned at 310, having an opening in a prospective via region of the wafer. An in-situ process flow 312 is then performed in accordance with this aspect of the invention, wherein a via cavity is formed through the BARC, dielectric, and etch-stop layers, for example, concurrently in a single reactive ion etch (RIE) tool. At 314a, the exposed BARC layer is etched, using the patterned resist as a mask, and a via main etch is performed at 314b, creating a via cavity or opening in the dielectric layer. A via over-etch process is then performed at 314c to remove the remaining portion of the dielectric material in the via cavity and to expose a portion of the underlying etch-stop layer material. At 316, an etch-stop layer etch (e.g., an RIE etch operation) is then performed to remove the exposed portion of the etch-stop material, thereby extending the cavity and exposing a conductive feature in the underlying interconnect structure.

As with the above single damascene case (e.g., FIG. 3 above), substantially no other processing is performed between the via etch acts of 314a–314c and the etch-stop etch of 316. The via etch at 314a–314c and the etch-stop etch at 316 may, but need not be, performed in-situ within a single RIE etch tool, wherein other implementations are possible within the scope of the invention, in which the etch-stop etch at 316 is performed concurrently with the via etch 314 or immediately thereafter. In addition, the invention also contemplates alternative implementations in which the via and etch-stop etch acts are performed with substantially no processing steps therebetween. For example, no ashing or wet etch operations are performed between the exemplary via etch 314 and the etch-stop layer etch at 316 in the illustrated method 300. In this regard, the exemplary method 300 provides coverage of the upper dielectric surface during the etch-stop etch at 316 because the patterned resist mask remains until after the etch-stop etch 316.

Although the exemplary method 300 provides in-situ etching of the via cavity through the dielectric layer (e.g., 314) and etch-stop etching to extend the via cavity through the etch-stop layer, other implementations are possible within the scope of the present invention where these or equivalent acts are performed in different etch tools. Moreover, one or more process acts may be performed between the via etch and the etch-stop etch acts in accordance with the invention where the dielectric layer is covered during the etch-stop etch. In the illustrated method 300, the resist mask from the via etch steps remains during the etch-stop etch 316. However, other implementations are possible within the scope of the invention, wherein the all or a portion of the dielectric is covered by any means during the entirety of, or during a portion of, the etch-stop etch 316. Further, although the exemplary method 300 provides a multi-step etch (e.g., 314b, 314c) through the dielectric layer, other implementations are contemplated, wherein any of the BARC etch, the via etch, and/or the etch-stop etch acts may be single step or multi-step operations, within the scope of the present invention.

In the exemplary method 300, the etching acts 314a–314c and 316 are performed in a single RIE etch tool, with appropriate etch chemistries being changed accordingly, to remove material from the exposed layer (e.g., from the BARC layer, then the dielectric layer, and then the etch-stop layer). Furthermore, while illustrated and described with respect to organic BARC materials, OSG type low-k dielectric material, and SiC or SiN etch-stop layer materials, any appropriate materials may be employed in forming these layers in accordance with the invention, where appropriate etch chemistries and selectivities may be selected in performing the etch operations 314–316 to fabricate the via cavity. In the illustrated method 300, the main etch at 314b removes the majority of the dielectric material in the cavity, leaving about 1000–2000 Å of OSG low-k dielectric material remaining. The process parameters are then switched to the over-etch at 314c, which is time controlled to stop on the etch-stop layer, wherein the exemplary via over-etch at 314c has a higher selectivity to the etch-stop layer than does the via main etch at 314b.

With the etch-stop layer exposed, the etch process is again adjusted for etching the etch-stop material at 316 with a selectivity to the underlying (e.g., pre-existing) interconnect structure, so as to expose an underlying conductive feature (e.g., copper structure). As with the single damascene case, the dual damascene method 300 preserves the resist mask over the dielectric layer while etching the exposed portion of the etch-stop layer at 316, since there is no intervening ashing or wet etch process to remove the via resist mask. Consequently, etch-stop etch related damage to the dielectric material is mitigated or avoided during the etch-stop etch at 316, by which the via CD and profile are protected. After the in-situ process at 312, the method 300 proceeds to 318, where an ashing operation is performed to remove the resist mask initially formed at 310, and the BARC material deposited at 308. A wet clean operation is then optionally performed at 320 to remove any polymer remaining from the RIE etch acts.

Referring also to FIG. 6B, a second BARC layer is then formed at 322, and a trench resist mask is formed and patterned at 324. A two step trench etch 326 is then performed, comprising a trench BARC etch at 328a and a patterned trench main etch at 328b. Thereafter at 330, another ashing operation is performed to strip the trench resist mask and the second BARC layer, followed by another wet clean operation at 332. A diffusion barrier is then formed at 334, and a seed copper layer is deposited over the diffusion barrier at 336, to facilitate subsequent copper filling of the via and trench cavities. The trench and via cavities are then filled with copper using an ECD process at 338, and a CMP process is performed at 340 to planarize the upper surface of the device, before the method 300 ends at 342. It is noted that alternative implementations are possible within the scope of the invention, wherein the trench is formed prior to formation of the via cavity, wherein the via etch and etch-stop etch operations are performed concurrently, and/or with substantially no processing operations therebetween, and/or with the dielectric layer at least partially covered during the etch-stop etch, as described above.

Figure 7A:
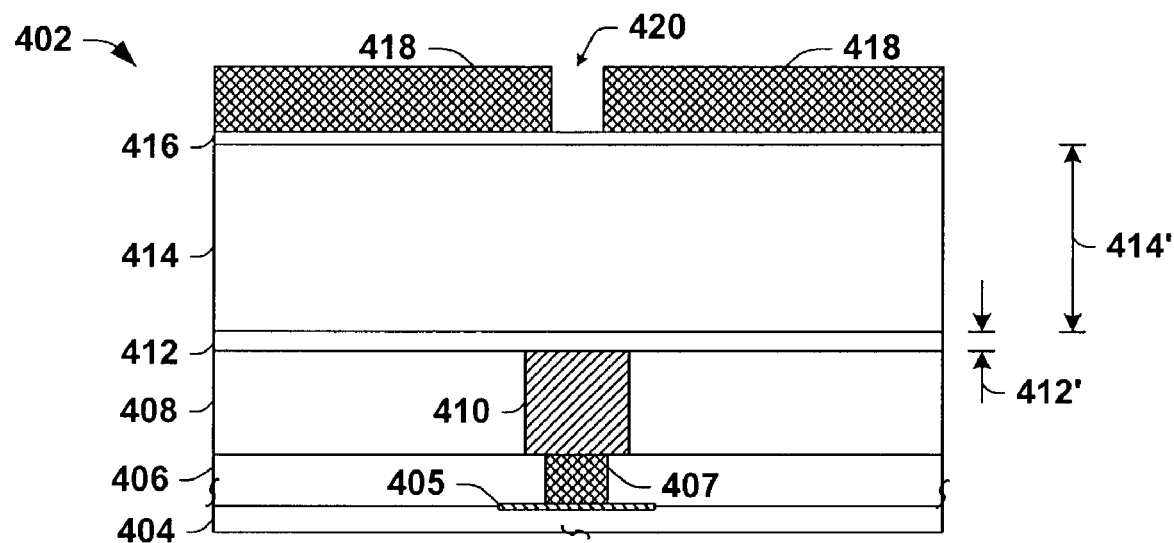
FIGS. 7A–7N are partial side elevation views in section illustrating fabrication of an exemplary via-first dual damascene interconnect structure in accordance with the invention.
Figure 7B:
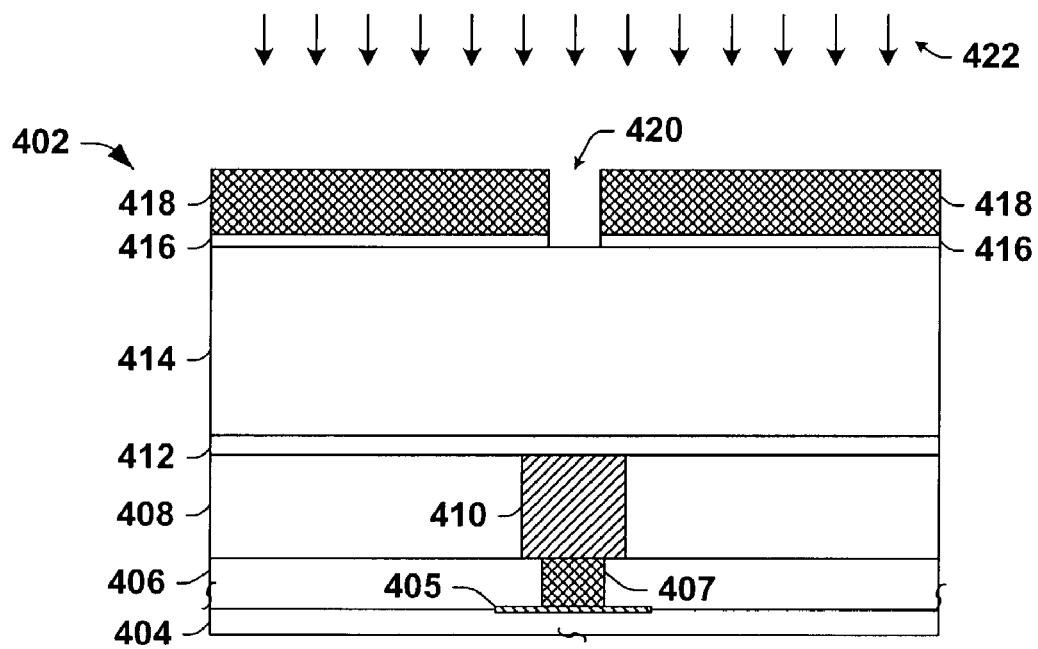
Figure 7C:
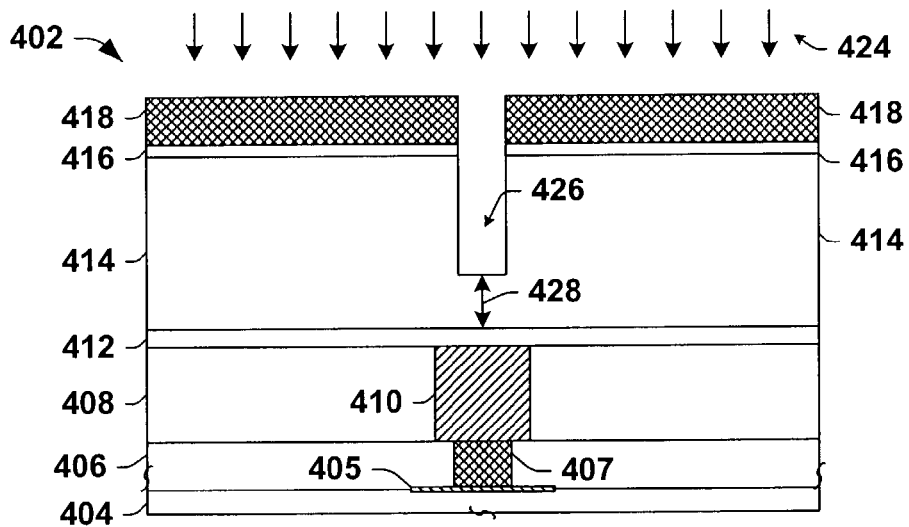
Figure 7D:
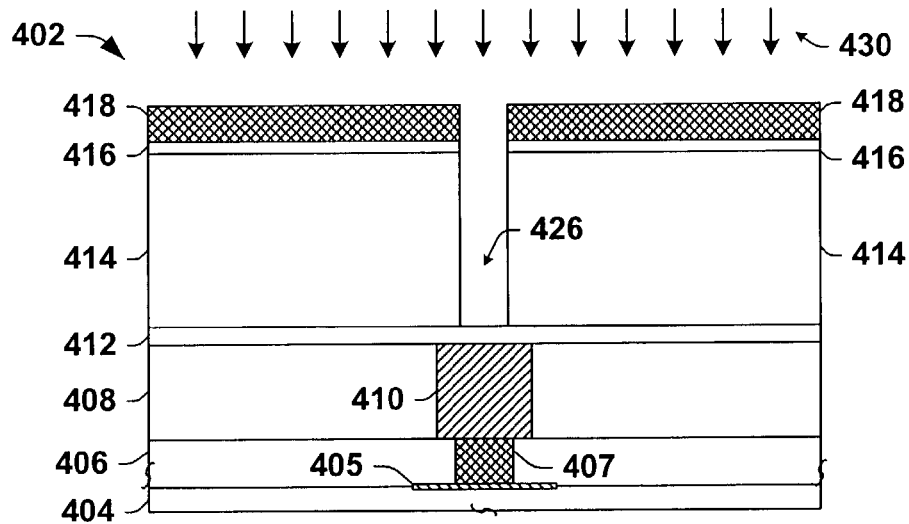
Figure 7E:
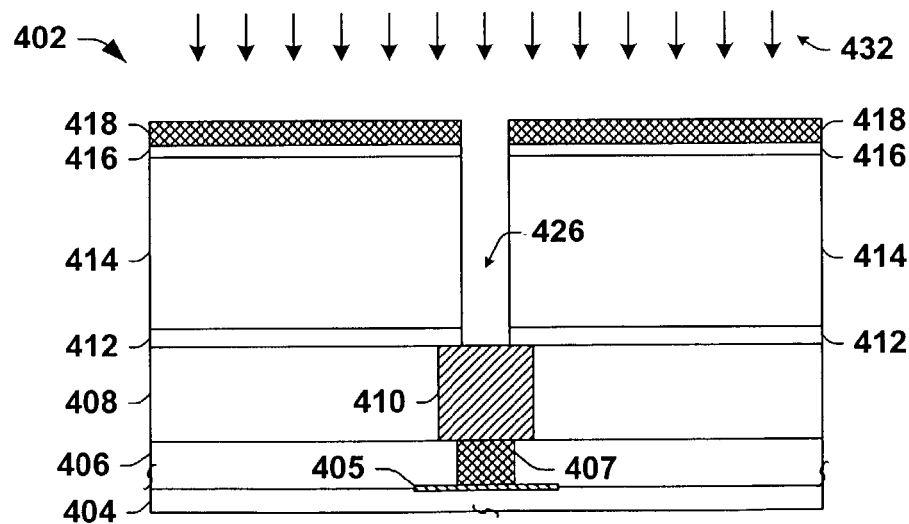
Figure 7F:
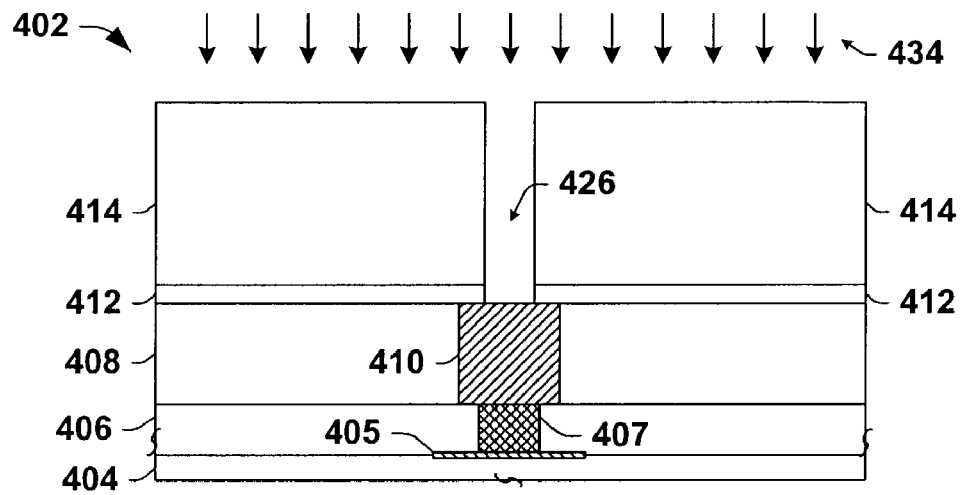
Figure 7G:
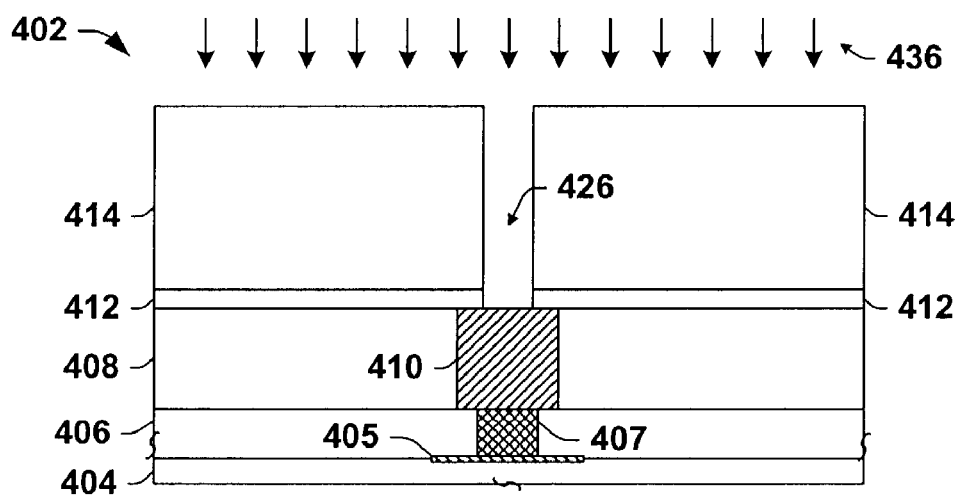
Figure 7H:
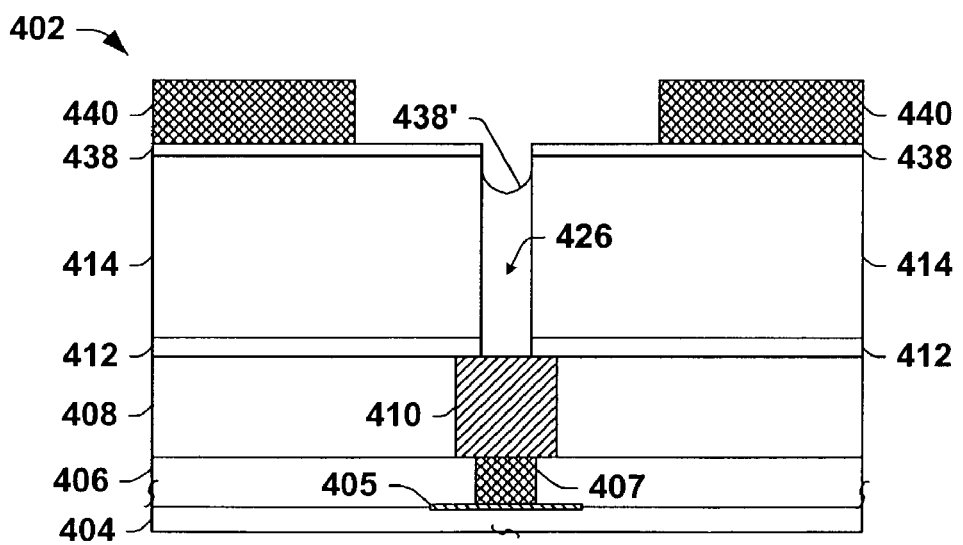
Figure 7I:
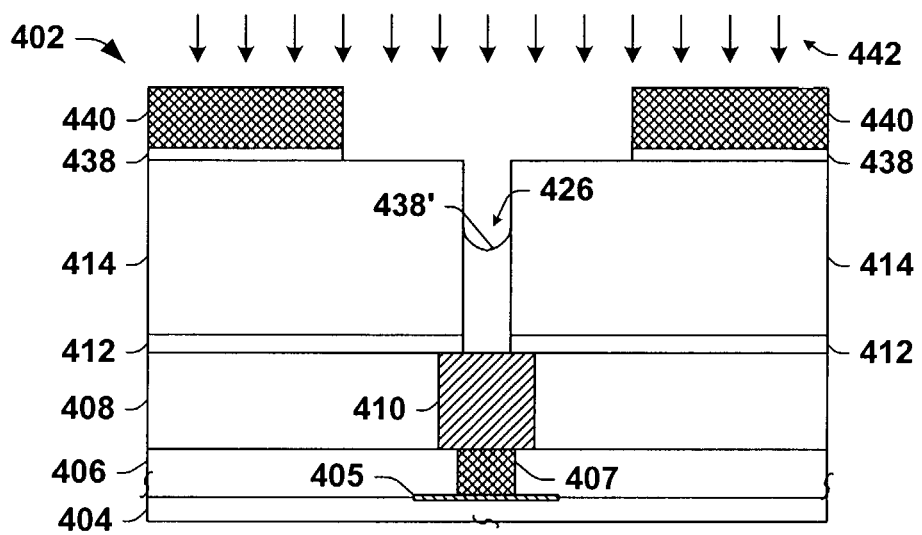
Figure 7J:
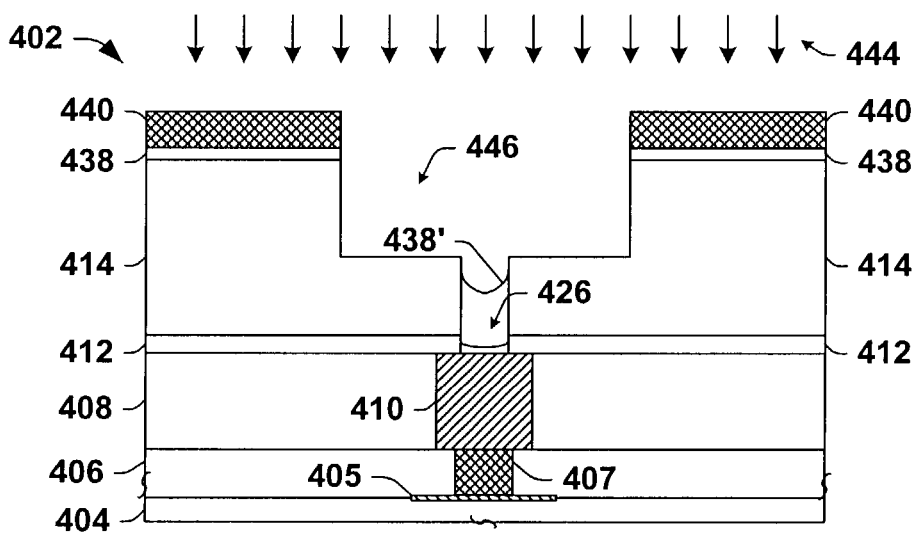
Figure 7K:
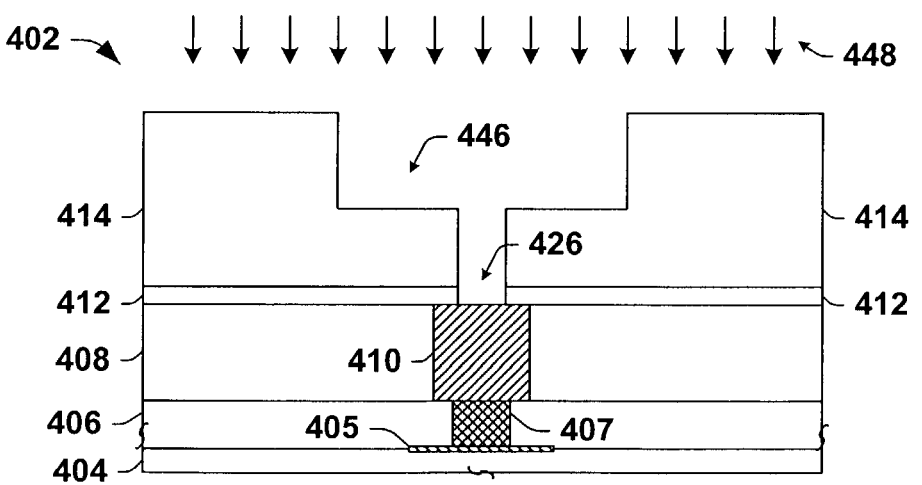
Figure 7L:
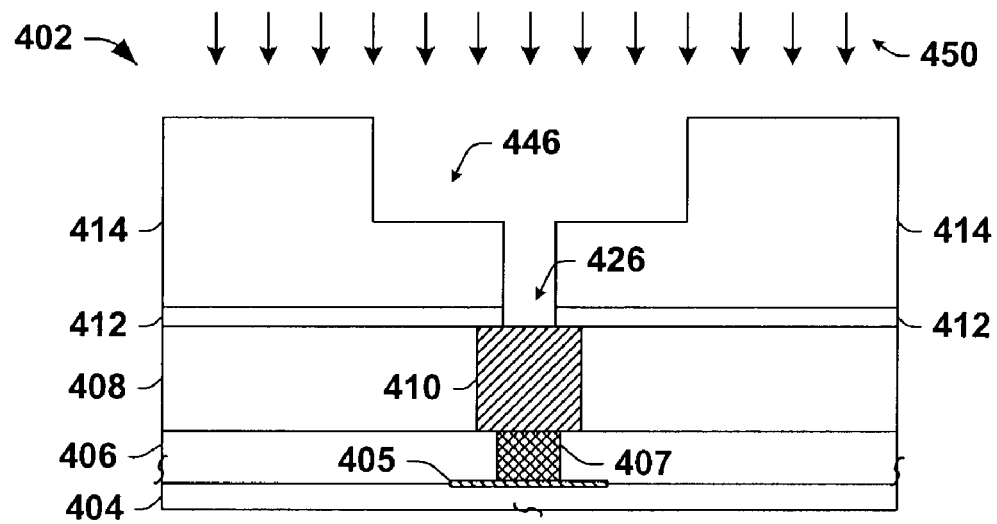
Figure 7M:
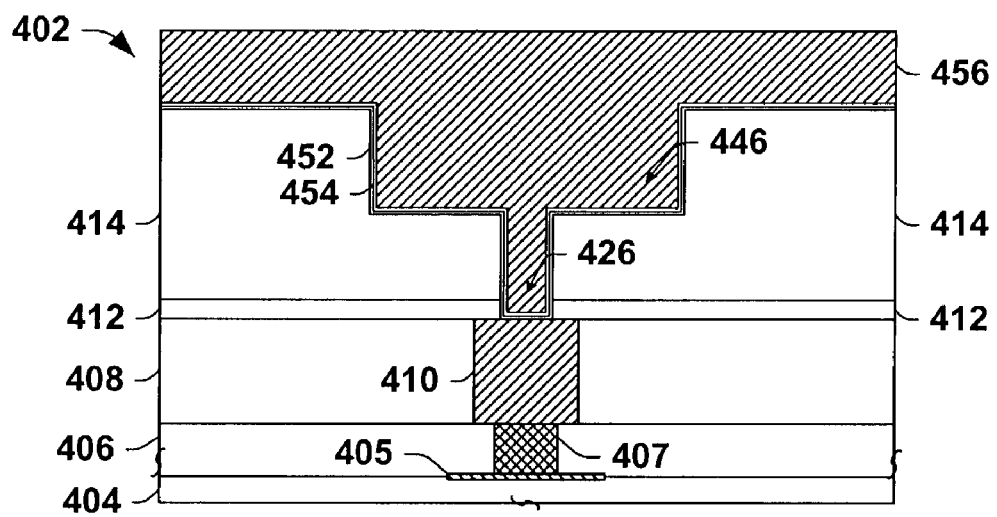
Figure 7N:
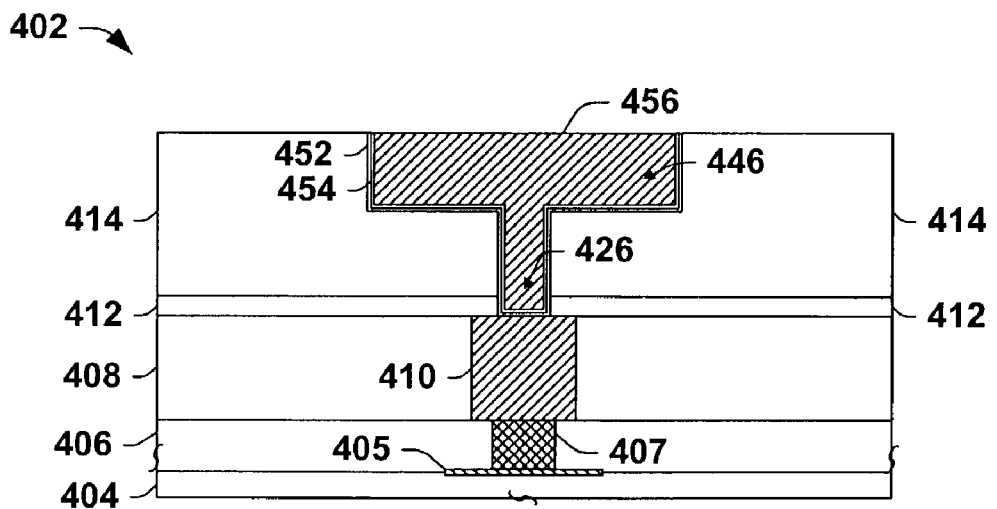

Referring now to FIGS. 7A–7N, another exemplary wafer 402 is illustrated undergoing dual damascene interconnect processing in accordance with the invention. FIG. 7A illustrates the wafer 402 at an intermediate stage of fabrication, comprising a silicon substrate 404, in which a conductive silicide structure 405 is formed. An initial contact layer is formed over the substrate 404, comprising a dielectric 406 with a tungsten contact 407 extending therethrough, and electrically contacting the silicide 405. An existing interconnect structure overlies the contact layer, including an etch-stop layer (not shown) and a dielectric 408 in which a conductive feature 410 is formed, such as copper trench metal, to provide electric coupling to the tungsten contact 407. As with the single damascene methods of the invention, the dual damascene processing of the present invention may be carried out in fabricating an interconnect structure over an initial contact structure, such as illustrated in FIG. 7A, and/or in forming such a structure over another single or dual damascene structure in a multi-layer interconnect network structure.

A SiN or SiC etch-stop layer 412 is formed over the existing interconnect dielectric material 408 and over the conductive feature 410, for example, to a thickness 412' of about 600–800 Å, and a dielectric layer 414, such as a low-k OSG dielectric material or the like, is formed over the etch-stop layer 412 to a thickness 414' of about 7000–8000 Å. An organic BARC layer 416 overlies the dielectric 414, having a thickness of about 600–800 Å, and a via resist mask 418 is formed over the BARC layer 416, having an opening 420 in a prospective via region. In FIG. 7B, a via BARC etch process 422 is performed to remove the BARC layer 416 in the via region 420. In FIG. 7C, a via main etch process 424 is used to form a via cavity 426 in the dielectric layer 414, leaving a thickness 428 of dielectric material 414 unetched at the bottom of the via cavity 426 (e.g., about 1000–2000 Å). A via over-etch process 430 is employed in FIG. 7D to further form the cavity 426 through the rest of the dielectric layer 414, stopping on and exposing a portion of the underlying etch-stop layer 412. An etch-stop etch 432 is performed immediately thereafter (e.g., concurrently with the over-etch 426) in FIG. 7E to expose the underlying conductive contact 410.

Thereafter in FIG. 7F, a resist ashing process 434 is used to remove the remaining resist mask 418 layer and the BARC layer 416, and a wet clean operation 436 is performed in FIG. 7G. As illustrated in FIG. 7H, a second BARC layer 438 is then formed over the wafer 402, wherein some of the BARC material 438' is formed at the bottom of the via cavity 426. A trench resist mask 440 is formed over the BARC layer 438, and a trench BARC etch process 442 is performed in FIG. 7I to remove the BARC material in the prospective trench region of the wafer 402, with a portion of the BARC 438' remaining in the via cavity 426. Thereafter in FIG. 7J, an RIE trench etch process 444 is employed to form a trench cavity 446 in the dielectric layer 414, wherein a certain amount of residual BARC material 438' may still remain in the bottom of the via cavity 426 during the trench etch process 444. Following the trench etch process 444, another ashing process 448 is performed in FIG. 7K to remove the trench resist mask 440 and any remaining BARC material (e.g., BARC 438' in the via cavity 426), after which another wet clean process 450 is performed in FIG. 7L.

As illustrated in FIG. 7M, a copper diffusion barrier layer 452 and a copper seed layer 454 are formed, after which copper fill material 456 is deposited over the wafer 402 to fill the trench and via cavities 446 and 426, respectively, for example, using an ECD process. Thereafter in FIG. 7N, the wafer 402 is planarized, for example, using a CMP process, to complete the conductive dual damascene trench and via structure. One or more subsequent interconnect levels or layers may thereafter be constructed over the structure of FIG. 7N, for example, using the above-described or other single and/or dual damascene fabrication techniques. Any number of such layers or levels may be fabricated in accordance with the present invention, to provide electrical coupling to the conductive feature (e.g., silicide structure 406) in the wafer 402.

Figure 8A:
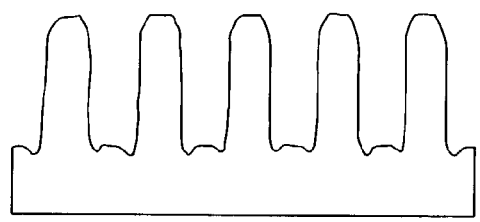
FIG. 8A is a cross-sectional side elevation view image of dual damascene routing trenches formed according to conventional processes following etch-stop etching.
Figure 8B:
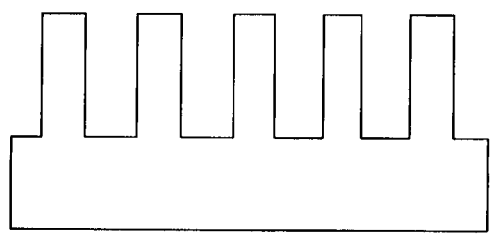
FIG. 8B is a cross-sectional side elevation view image of dual damascene routing trenches formed according to the present invention following etch-stop etching.
Figure 8C:
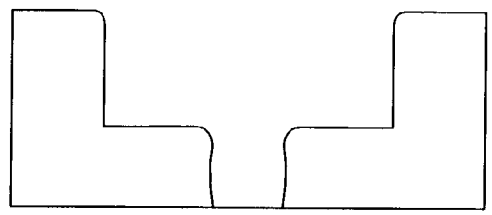
FIG. 8C is a cross-sectional side elevation view image of a dual damascene trench and via structures formed according to conventional processes following etch-stop etching.
Figure 8D:
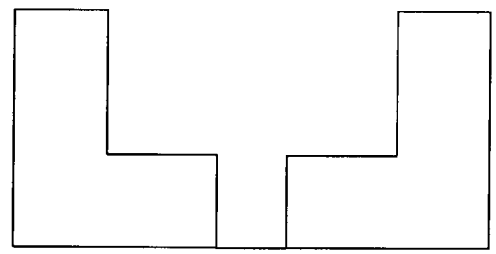
FIG. 8D is a cross-sectional side elevation view image of a dual damascene trench and via structures formed according to the present invention following etch-stop etching.

Referring also to FIGS. 8A–8D, illustrations are provided showing cross-sectional views of conventional dual damascene structures and dual damascene interconnect structures fabricated in accordance with the in-situ etch-stop etch processing of the present invention (e.g., method 300 above). FIGS. 8A and 8C illustrate different portions of a wafer undergoing the same conventional processing, where the portion of FIG. 8A shows dual damascene routing trenches, and the portion of FIG. 8C shows a dual damascene trench and via. FIGS. 8B and 8D illustrate different portions of another wafer undergoing the same dual damascene interconnect processing according to the invention, wherein the portion of FIG. 8B shows dual damascene routing trenches, and the portion of FIG. 8D shows a dual damascene trench and via.

FIGS. 8A and 8B illustrate images 460 and 462, respectively, wherein the image 460 shows dual damascene routing trenches formed according to a conventional process following etch-stop etching, and the image 462 shows routing trenches formed according to the present invention. As can be seen in the image 460 of FIG. 8A, the upper ends of the trench sidewalls are rounded off, and micro-trenching is seen at the bottom trench corners. In addition, the conventional trenches in FIG. 8A suffer from profile bowing. The dual damascene processing of the present invention, on the other hand, provides significantly improved trench profile and CD uniformity, as seen in the image 462 of FIG. 8B. Furthermore, the conventional processing in FIGS. 8A and 8C results in material loss from the top surface and the trench bottoms during etch-stop etching, which is not experienced in the wafer of FIGS. 8B and 8D.

FIGS. 8C and 8D provide cross-sectional images 464 and 466, respectively, of dual damascene trench and via structures following etch-stop etching, wherein the wafer of FIG. 8C is processed according to conventional techniques and the wafer of FIG. 8D is processed according to the invention. Again, it is seen that the conventional dual damascene structure in the image 464 of FIG. 8C suffers from more rounding and bowing of the tops and sidewalls, respectively, of the trench and vias than does the wafer in the image 466. In addition, more dielectric thickness reduction is seen on the top surface and at the bottom of the trench in the wafer of FIG. 8C than in that of FIG. 8D. While the above dual damascene examples are illustrated and described in the context of via-first techniques, it will be understood by those of ordinary skill in the art that one or more aspects of the invention may be carried out in trench-first dual damascene processes, and in other dual damascene approaches. In this respect, the invention and the appended claims are not limited to the illustrated implementations herein.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming a dual damascene interconnect structure overlying an existing interconnect structure in a semiconductor wafer to provide electrical coupling to a conductive feature in the existing interconnect structure, the method comprising:

forming an etch-stop layer directly on the existing interconnect structure;

forming dielectric layer over the etch-stop layer;

forming a resist pattern over the dielectric layer;

forming a via cavity through a portion of the dielectric layer to expose a portion of the etch-stop layer;

then, extending the via cavity through a portion of the etch-stop layer to expose the conductive feature in the existing interconnect structure with substantially no processing steps between forming and extending the via cavity;

then, removing the resist pattern;

then, etching the dielectric layer to form a trench cavity in the dielectric layer; and forming a conductive material in the trench and via cavities to provide electrical coupling to the conductive feature in the existing interconnect structure.

2. The method of claim 1, wherein forming the etch-stop layer comprises depositing a layer of SiN or SiC over the existing interconnect structure and wherein forming the dielectric layer comprises depositing a layer of low-k dielectric material over the etch-stop layer.

3. The method of claim 1, wherein forming the via cavity through the portion of the dielectric layer comprises etching the portion of the dielectric layer to form the via cavity and to expose the portion of the etch-stop layer using a via etch process, and wherein extending the via cavity through the portion of the etch-stop layer comprises etching an exposed portion of the etch-stop layer to expose the conductive feature in the existing interconnect structure using an etch-stop etch process.

4. The method of claim 3, wherein the via etch process comprises an RIE etch, and wherein the etch-stop etch process comprises an RIE etch.

5. The method of claim 1, wherein forming the via cavity and extending the via cavity are performed concurrently.

6. The method of claim 1, wherein forming the via cavity and extending the via cavity are performed in-situ in a single etch tool.

7. The method of claim 1, wherein extending the via cavity is performed immediately after forming the via cavity.

* * * * *